US010280508B2

(12) United States Patent
Soininen et al.

(10) Patent No.: US 10,280,508 B2
(45) Date of Patent: May 7, 2019

(54) NOZZLE HEAD AND APPARATUS FOR COATING SUBSTRATE SURFACE

(71) Applicant: BENEQ OY, Espoo (FI)

(72) Inventors: Pekka Soininen, Espoo (FI); Olli Pekonen, Espoo (FI)

(73) Assignee: BENEQ OY, Espoo (FI)

( * ) Notice: Subject to any disclaimer, the term of this patent is extended or adjusted under 35 U.S.C. 154(b) by 0 days.

(21) Appl. No.: 15/533,825

(22) PCT Filed: Dec. 21, 2015

(86) PCT No.: PCT/FI2015/050923
§ 371 (c)(1),
(2) Date: Jun. 7, 2017

(87) PCT Pub. No.: WO2016/102771
PCT Pub. Date: Jun. 30, 2016

(65) Prior Publication Data
US 2017/0362706 A1 Dec. 21, 2017

(30) Foreign Application Priority Data

Dec. 22, 2014 (FI) .................................... 20146132

(51) Int. Cl.
C23C 16/455 (2006.01)
C23C 16/54 (2006.01)
(Continued)

(52) U.S. Cl.
CPC .. C23C 16/45529 (2013.01); C23C 16/45551 (2013.01); C23C 16/45563 (2013.01);
(Continued)

(58) Field of Classification Search
USPC ................. 118/715, 724, 729, 313–315, 325
See application file for complete search history.

(56) References Cited

U.S. PATENT DOCUMENTS 6,357,866 B1 * 3/2002 van Rensburg ..... B05B 17/0607
347/75
7,997,288 B2 * 8/2011 Ravkin .................... B08B 3/04
134/102.3
(Continued)

FOREIGN PATENT DOCUMENTS

EP 2 557 198 A1 2/2013
JP 2012201898 A 10/2012
(Continued)

OTHER PUBLICATIONS

International Search Report issued by the Finnish Patent and Registration Office acting as the International Searching Authority in relation to Finnish Application No. PCT/FI2015/050923 dated Apr. 26, 2016 (4 pages).
(Continued)

Primary Examiner — Yewebdar T Tadesse
(74) Attorney, Agent, or Firm — Robert P. Michal, Esq.; Carter, DeLuca & Farrell LLP

(57) ABSTRACT

A nozzle head, apparatus and method for providing a coating on a surface of a substrate by subjecting the surface of the substrate to successive surface reactions of at least two precursors according to principles of atomic layer deposition. The nozzle head comprises an output face provided with at least two different precursor zones, the at least two different precursor zones being arranged to provide different coating layers on the surface of the substrate.

22 Claims, 14 Drawing Sheets

(51) Int. Cl.
*C30B 25/14* (2006.01)
*H01L 21/67* (2006.01)
*H01L 21/68* (2006.01)

(52) U.S. Cl.
CPC ............ *C23C 16/54* (2013.01); *C23C 16/545* (2013.01); *C30B 25/14* (2013.01); *H01L 21/6719* (2013.01); *H01L 21/67173* (2013.01); *H01L 21/681* (2013.01)

(56) References Cited

U.S. PATENT DOCUMENTS

| | | |
|---|---|---|
| 2007/0224348 A1 | 9/2007 | Dickey et al. |
| 2008/0085652 A1* | 4/2008 | Winters ................ H01L 27/322 445/4 |
| 2009/0078204 A1 | 3/2009 | Kerr et al. |
| 2009/0081826 A1* | 3/2009 | Cowdery-Corvan ........................ C23C 16/407 438/104 |
| 2009/0165715 A1 | 7/2009 | Oh |
| 2010/0037820 A1 | 2/2010 | Lee |
| 2012/0141676 A1* | 6/2012 | Sershen ............ C23C 16/45551 427/255.23 |
| 2015/0197090 A1* | 7/2015 | Akahane ................ B41J 2/2103 347/47 |

FOREIGN PATENT DOCUMENTS

| | | | |
|---|---|---|---|
| KR | 2013-0142869 A | 12/2013 | |
| WO | WO-2010/109076 A1 | 9/2010 | |
| WO | WO-2014197396 A1 * | 12/2014 | ....... C23C 16/45551 |

OTHER PUBLICATIONS

Finnish Search Report issued by the Finnish and Registration Office Patent Office in relation to Finnish Application No. 20146132 dated Jul. 14, 2015 (2 pages).
Finnish Office Action issued by the Finnish Patent and Registration Office in relation to Finnish Application No. 20146132 dated Mar. 29, 2016 (1 page).
Written Opinion of the International Searching Authority issued by the Finnish Patent and Registration Office acting as the International Searching Authority in relation to Finish Application No. PCT/FI2015/050923 dated Apr. 26, 2016 (6 pages).

* cited by examiner

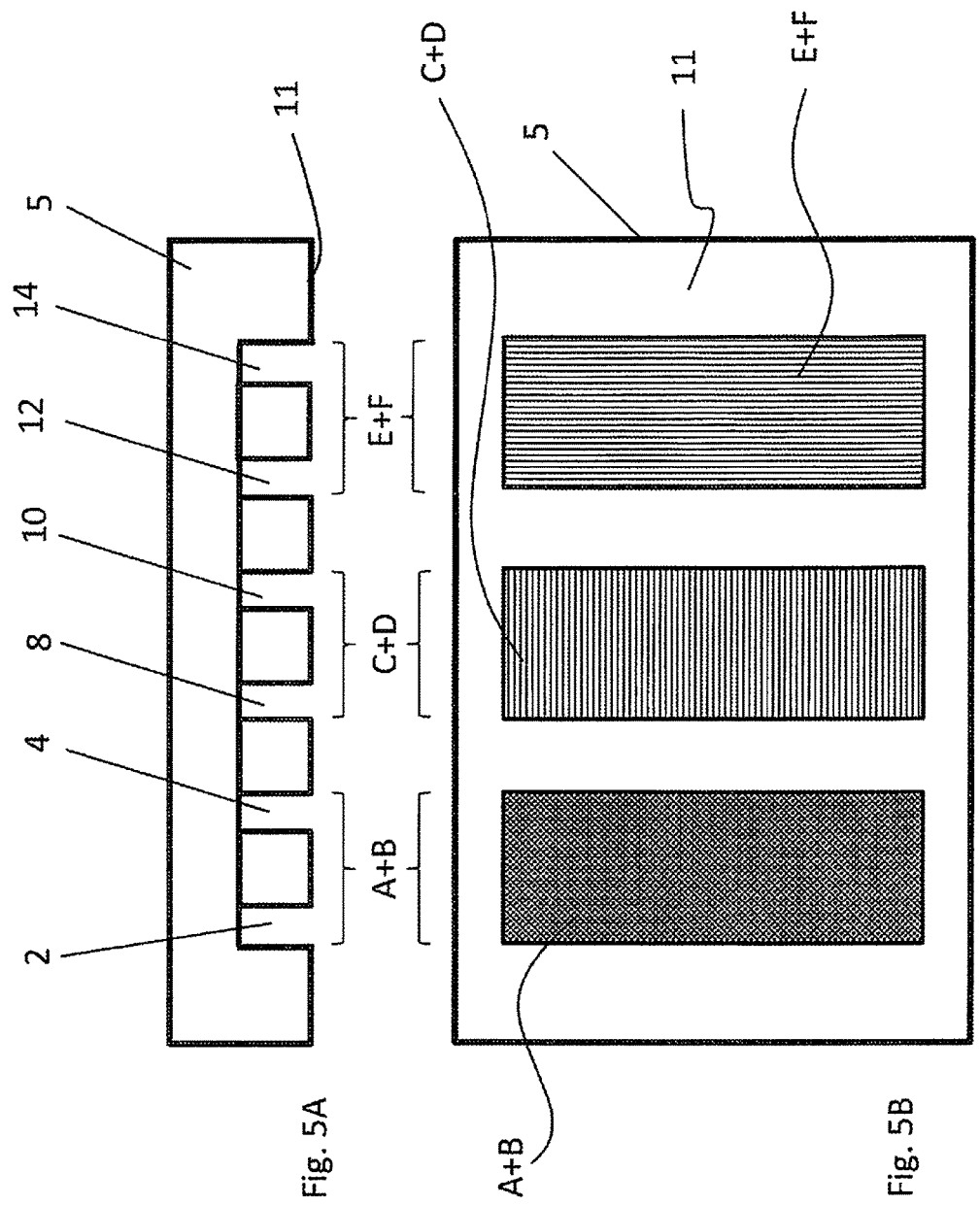

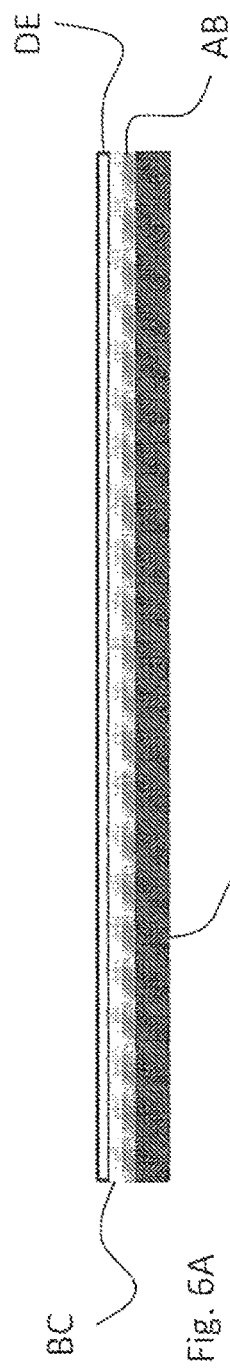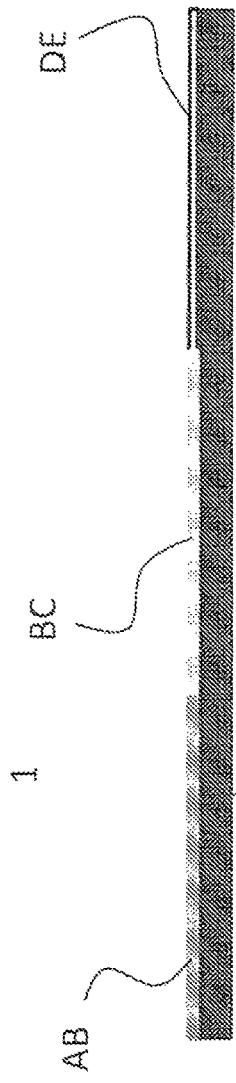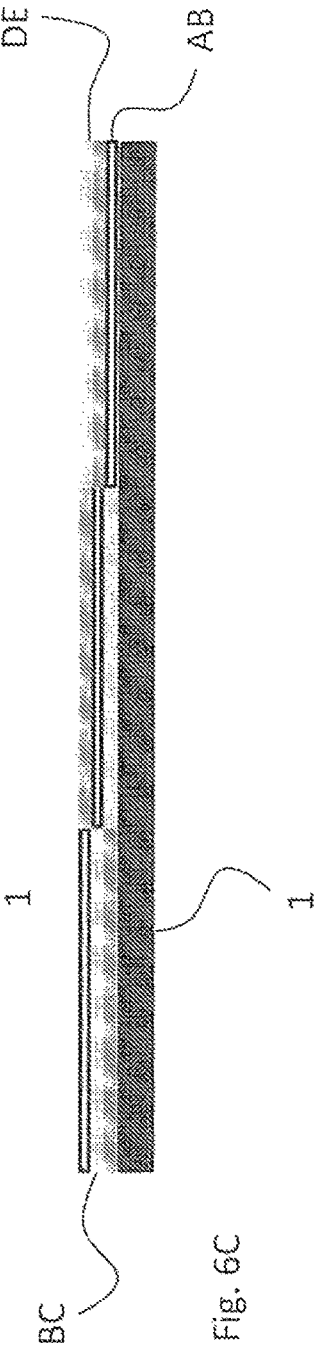

NOZZLE HEAD AND APPARATUS FOR COATING SUBSTRATE SURFACE

FIELD OF THE INVENTION

The present invention relates to a nozzle head for providing a coating on a surface of a substrate by subjecting the surface of the substrate to successive surface reactions of at least two precursors according to principles of atomic layer deposition. The present invention also relates to an apparatus for a coating process in which coating layers are provided on a surface of a substrate by successive surface reactions of at least two precursors according to the principles of atomic layer deposition.

BACKGROUND OF THE INVENTION

Atomic layer deposition (ALD) is used for providing coating layers on substrates for manufacturing products, such as semiconductors, electrical components, optical components or photovoltaic cells. According to the basic characteristics of ALD the coating layers grow on all surfaces of the substrate and cover each surface fully. However, when manufacturing such products it is not always desirable to provide coating layers which cover one surface entirely. For example electrical connections may be provided to the substrates and it is not desirable to form coating layers on the electrical connections. Therefore it is desirable to manufacture substrates for products production in which coating ALD coating layers are formed only on limited sub-areas of a surface of the substrate. In some applications two or more superposed coating layers are needed for forming nanolaminate coating structures. Furthermore, in many applications different coating layers are needed at different areas or sub-areas of the surface of the substrate. Some areas sub-areas may also need two or more superposed coating layers while other areas of the surface of the substrate only need one coating layer or different superposed coating layers.

In prior art differently coated areas of the surface of the substrate or different superposed or adjacent coating layers on the surface of the substrate are always provided in different manufacturing steps. Nanolaminates are produced such that first one coating layers are formed on the surface of the substrate and subsequently a second coating layer of different coating material is provided on the surface of the substrate. This is inefficient in industrial processes.

In prior art substrates having only limited sub-areas of a substrate coated with ALD coating layers are formed by two different manners: preventing coating formation of coating layers on the surface of a substrate using masks covering a portion of the surface of the substrate, or removing coating layers from a portion of the surface of the substrate after the coating process. Masks or the like are placed on the surface of the substrate to prevent material growth on the area of the surface of the substrate which the mask covers during the coating process. Produced coating layers are usually removed from the surface of the substrate by etching or the like removal process after the coating layers are produced on the surface of the substrate.

The prior art methods for producing substrates having ALD coating layers only on limited sub-areas of a surface of the substrate require additional process steps to be performed before the actual coating process or after the actual coating process as mentioned above relating to the use of masks and removal of portions of the produced coating layers. These additional process steps lower the production efficiency as they are time consuming and make the production process more complicated. Furthermore, masking does not efficiently prevent coating layers from growing on the masked areas as the precursor gases tend to penetrate from the edge regions of the mask between the mask and the surface of the substrate.

BRIEF DESCRIPTION OF THE INVENTION

An object of the present invention is to provide a nozzle head, apparatus and method so as to overcome or at least alleviate the prior art disadvantages. The objects of the invention are achieved by a nozzle head which is characterized by what is stated in the characterizing portion of the claim 1. The objects of the present invention are also achieved with an apparatus which is characterized by what is stated in the characterizing portion of the claim 17.

The preferred embodiments of the invention are disclosed in the dependent claims.

The invention is based on the idea of providing a nozzle head for providing a coating on a surface of a substrate by subjecting the surface of the substrate to successive surface reactions of at least two precursors according to principles of atomic layer deposition. The nozzle head comprises an output face via which the at least two precursors are supplied to the surface of the substrate. The output face has a width extending transversely to the relative moving direction of the nozzle head and the substrate and length extending in the relative moving direction of the nozzle head and the substrate. The output face comprises two or more precursor zones provided to the output face of the nozzle head and arranged to supply at least two precursors to the surface of the substrate for forming a coating layer on the surface of the substrate. According to the present invention at least two of the precursor zones have a width less than the width of the output face and arranged at different locations on the output face of the nozzle head in the direction of the width of the output face.

In one embodiment at least two of the precursor zones have a width less than the direction of the width of the output face and arranged adjacently to each other or in line on the output face of the nozzle head in the direction of the width of the output face.

In another embodiment at least two of the precursor zones have a width less than the width of the output face and arranged at different locations on the output face of the nozzle head in the direction of the width of the output face and at different locations on the output face of the nozzle head in the direction of the length of the output face.

In yet other embodiment at least two of the precursor zones are arranged at least party overlapped in the direction of the length of the output face.

The nozzle head may also comprise one or more first precursor zones provided to the output face of the nozzle head and arranged to supply at least two precursors to the surface of the substrate for forming a first coating layer on the surface of the substrate an done or more second precursor zones provided to the output face of the nozzle head and arranged to supply at least two precursors to the surface of the substrate for forming a second coating layer on the surface of the substrate, the second coating layer being different from the first coating layer. The first and second precursor zones may be arranged to supply different precursors for forming coating layers of different coating materials on the surface of the substrate. Alternatively or additionally the first and second precursor zones have different dimensions on the output face of the nozzle head for providing coating layer of different dimensions on the surface of the substrate.

The present invention is also based on the idea of providing an apparatus for a coating process in which coating layers are provided on a surface of a substrate by successive surface reactions of at least two precursors according to the principles of atomic layer deposition. The apparatus comprises a nozzle head having an output face having a width extending transversely to the relative moving direction of the nozzle head and the substrate and length extending in the relative moving direction of the nozzle head and the substrate. The apparatus also comprises moving system for moving the nozzle head relative to the substrate in a relative moving direction for subjecting the surface of the substrate to successive surface reactions of the at least two precursors. The output face is provided with at least two precursor zones arranged at different locations on the output face of the nozzle head in the direction of the width of the output face.

In one embodiment at least two of the precursor zones are arranged adjacently to each other or in line on the output face of the nozzle head in the direction of the width of the output face.

In another embodiment at least two of the precursor zones are arranged at different locations on the output face of the nozzle head in the direction of the width of the output face and at different locations on the output face of the nozzle head in the direction of the length of the output face.

The precursor zones may be arranged such that at least two of the precursor zones are arranged at least party overlapped in the direction of the length of the output face, or at least two of the precursor zones are arranged at least party overlapped in the direction of the width of the output face, or at least two of the precursor zones are arranged at least party overlapped in the direction of the length and in the direction of the width of the output face.

The output face of the nozzle head may comprise at least two different precursor zones, the at least two different precursor zones being arranged to provide different coating layers on the surface of the substrate. The apparatus is thus arranged to form different coating layer on the surface of the substrate by supplying precursors with the precursor supply system and moving the nozzle head. The different coating layers are achieved by arranging the precursor supply system and the first and second precursor zones to supply different precursors for forming coating layers of different coating materials on the surface of the substrate. Alternatively, the different coating layers are achieved with nozzle head having first and second precursor zones have different dimensions on the output face of the nozzle head for providing coating layer of different dimensions on the surface of the substrate and by moving the nozzle head relative to the substrate.

The different coating layers are achieved by supplying to the surface of the substrate at least first precursor and second precursor via the one or more first precursor zones provided to the output face of the nozzle head for forming a first coating layer on the surface of the substrate using two or more precursor zones which are arranged at different locations on the output face of the nozzle head in the direction of the width of the output face. Therefore different coating layers may be formed on different limited sub-areas of the surface of the substrate, or similar coating layers may be formed separately on different sub-areas of the surface of the substrate. Alternatively or additionally the different coating layers are provided on one or more first limited sub-areas of the surface of the substrate and one or more second limited sub-areas are left without coating layers by synchronised supply of the precursors from the precursor nozzles, respectively, and simultaneous moving of the nozzle head relative to the substrate.

Precursors in the present application may be chosen according to basic principles of the ALD method and depending on the type of film to be deposited. For example, for films comprising aluminium oxide ($Al_2O_3$), precursors (precursor A) trimethylaluminun (TMA) and water vapour (precursor B; $H_2O$) can be used. Other alternatives for aluminium oxide are aluminium chloride ($AlCl_3$; for precursor A) and ozone ($O_3$; for precursor B). Plasma may also be used to generate a reactive precursor locally from a relatively non-reactive vapor, for example plasma can generate highly reactive ozone ($O_3$) and related radicals from oxygen ($O_2$). Plasma may also be provided utilizing carrier gas or purge gas, for example such that the plasma is activated only occasionally, or alternatively continuously to turn a relatively non-reactive gas into a reactive one. Other precursor vapors can also be used, depending on the characteristics of the film to be grown, as is evident for a person skilled in the art.

An advantage of the present invention is that different coating layers may be provide on the surface of the substrate in one process step, such as several successive coating steps. The present invention further enables providing ALD coating layers only first limited sub-areas of a surface of the substrate without additional process steps carried out before or after the coating process. Accordingly in the present invention the coating layers are formed only on the predetermined first limited sub-areas of the surface of the substrate. This means that only these first limited sub-areas are subjected to successive surface reactions of the at least first and second precursor. The method and apparatus of the present invention enable providing sharp edged coated sub-areas in an efficient manner. Thus the present invention provides a simple and efficient process for industrial scale manufacturing.

BRIEF DESCRIPTION OF THE DRAWINGS

In the following the invention will be described in greater detail by means of preferred embodiments with reference to the attached [accompanying] drawings, in which

FIGS. 5A and 5B are another schematic view of an output face of the nozzle head of FIG. 3;

FIGS. 6A, 6B and 6C are schematic views of coating layers provided with the nozzle head of FIG. 3;

DETAILED DESCRIPTION OF THE INVENTION

The present invention relates to a nozzle head, coating apparatus and a coating method. In the context of this application detailed description and drawings of precursor supply system is omitted as they may be implemented in numerous ways. Basically the precursor supply system comprises gas sources, conduits, pumps and valves for delivering precursors. The apparatus may comprise vacuum pumps for operating the apparatus in vacuum environment in the reaction chamber. The vacuum pumps may be omitted if method and apparatus are operated at normal air pressure. In the context of this application also a very detailed description of moving system for moving the substrate(s) and precursor nozzles or nozzle head is omitted as also they may be implemented in various different ways. The operation of the apparatus may be controlled with a control system which may comprise several different electrical components, a control unit, such as a computer using control software, and other necessary components. The present invention is not limited to any specific precursor supply system, moving system or control system, but the present invention provides an operating method and apparatus for implementing the operating method.

Figure 1:
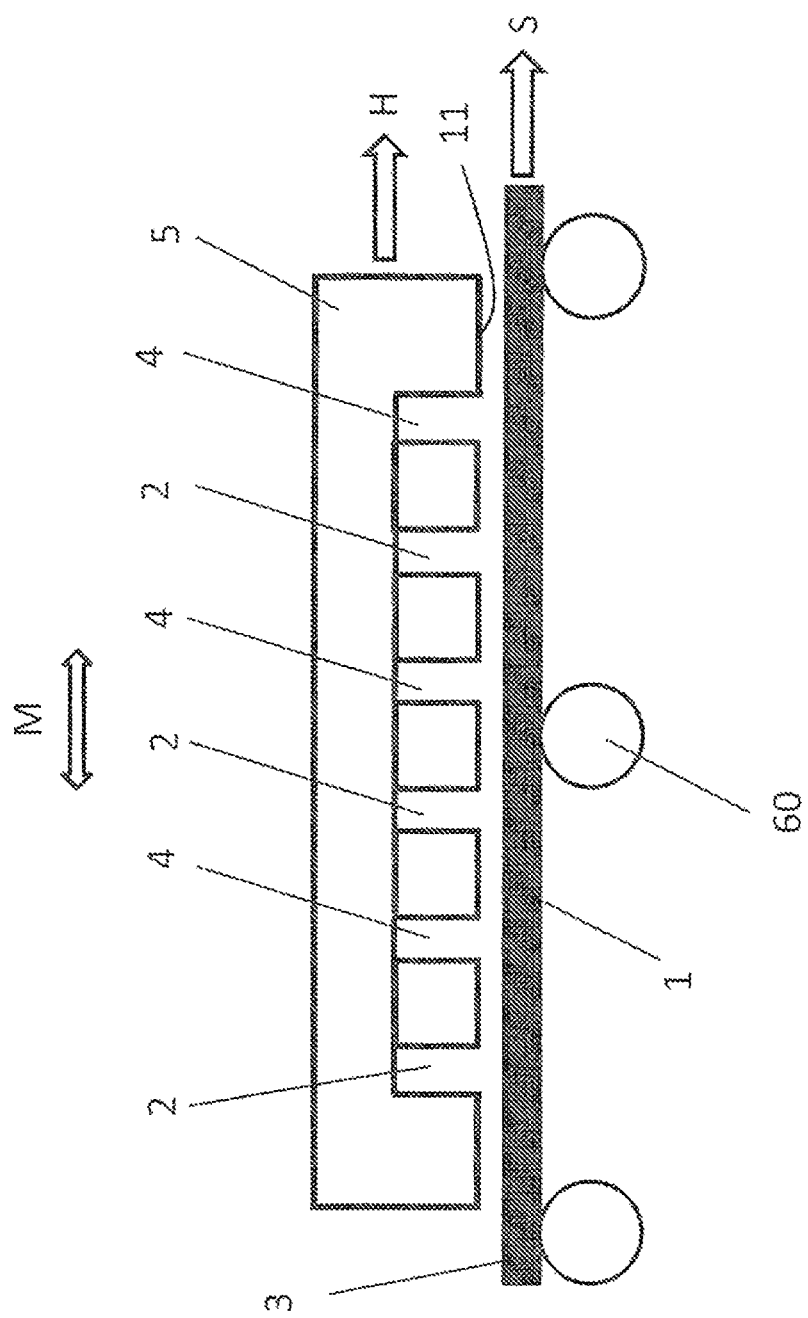
FIG. 1 is a schematic view of a prior art nozzle head.

FIG. 1 shows schematically a prior art apparatus for a coating process in which one or more coating layers are provided on a surface 3 of a substrate 1 by successive surface reactions of at least a first precursor and a second precursor according to the principles of atomic layer deposition. The apparatus comprises substrate moving system which in this embodiment comprises transport rolls 60 on which the substantially planar substrate 1 is transported in the direction of arrow S. The apparatus further comprises a nozzle head 5 arranged over the surface 3, top surface, of the substrate 1. The nozzle head 5 comprises an output face 11 which is placed towards the surface 3 of the substrate 1. The output face 11 comprises first precursor nozzles 2 and second precursor nozzles 4 arranged alternately in the moving direction S of the substrate 1. The nozzle head 5 or the apparatus may comprise at least one first precursor nozzle 2 and at least one second precursor nozzle 4. The first precursor nozzle 2 is arranged to supply first precursor on the surface 3 of the substrate and the second precursor nozzle 4 is arranged to supply second precursor on the surface 3 of the substrate 1. The first precursor nozzle 2 and the second precursor nozzle 4 are provided to the nozzle head 5 which is arranged to be moved in relation to the substrate 1 with the moving system so as the first precursor nozzle 2 and the second precursor nozzle are stationary in relation to each other.

In one operating mode of the embodiment of FIG. 1 the nozzle head 5, and thus the first and second precursor nozzles 2, 4, are kept stationary and the substrate 1, or series of substrates in form of separate substrate sheets, is transported or moved at constant speed in the direction of arrow S under the nozzle head 5 with the moving system. Alternatively the nozzle head 5 could be transported or moved at constant speed over the surface 3 of the substrate 1 or the nozzle head 5 and the substrate 1 could be transported at different constant speed in the same or opposite directions. In other words the nozzle head 5, and the first and second precursor nozzles 2, 4, is moved in relation to the substrate 1 with the moving system of the apparatus. Moving the nozzle head 5, or the first and second precursor nozzle 2, 4, in relation to the substrate 1 enables the surface 3 of the substrate 1 to be subjected to successive surface reactions of the first and second precursors supplied simultaneously and respectively from the first and second precursor nozzles 2, 4.

In another operating mode of the embodiment of FIG. 1 the substrate 1 is kept stationary and the nozzle head 5 is moved in reciprocating movement over the surface 3 of the substrate 1 in direction of arrow M with the moving system. The reciprocating movement of the nozzle head 5, and the first and second precursor nozzles 2, 4, simultaneously subjects the surface 3 of the substrate 1 successively to first and second precursor supplied from the first and second precursor nozzles 2, 4 as the surface of the substrate is subjected to both the first and second precursor due to the reciprocating movement of the nozzle head 5. Alternatively the substrate 1 may be moved in reciprocating movement correspondingly.

In yet another operating mode of the embodiment of FIG. 1 both the substrate 1 and the nozzle head 5, and the first and second precursor nozzles 2, 4, are moved at same average speed in the same direction of arrows S and H with the moving system. The nozzle head 5 is further moved in reciprocating movement over the surface 3 of the substrate 1 in direction of arrow M with the moving system. The reciprocating movement of the nozzle head 5, and the first and second precursor nozzle 2, 4 simultaneously subjects the surface 3 of the substrate 1 successively to first and second precursor supplied from the first and second precursor nozzles 2, 4. According to this embodiment the nozzle head 5 follows the movement of the substrate 1 and moves in the reciprocating movement at the same time. It should be noted that in alternative embodiment the substrate 1 may be moved in reciprocating movement and the nozzle head 5 only at constant speed.

Figure 2:
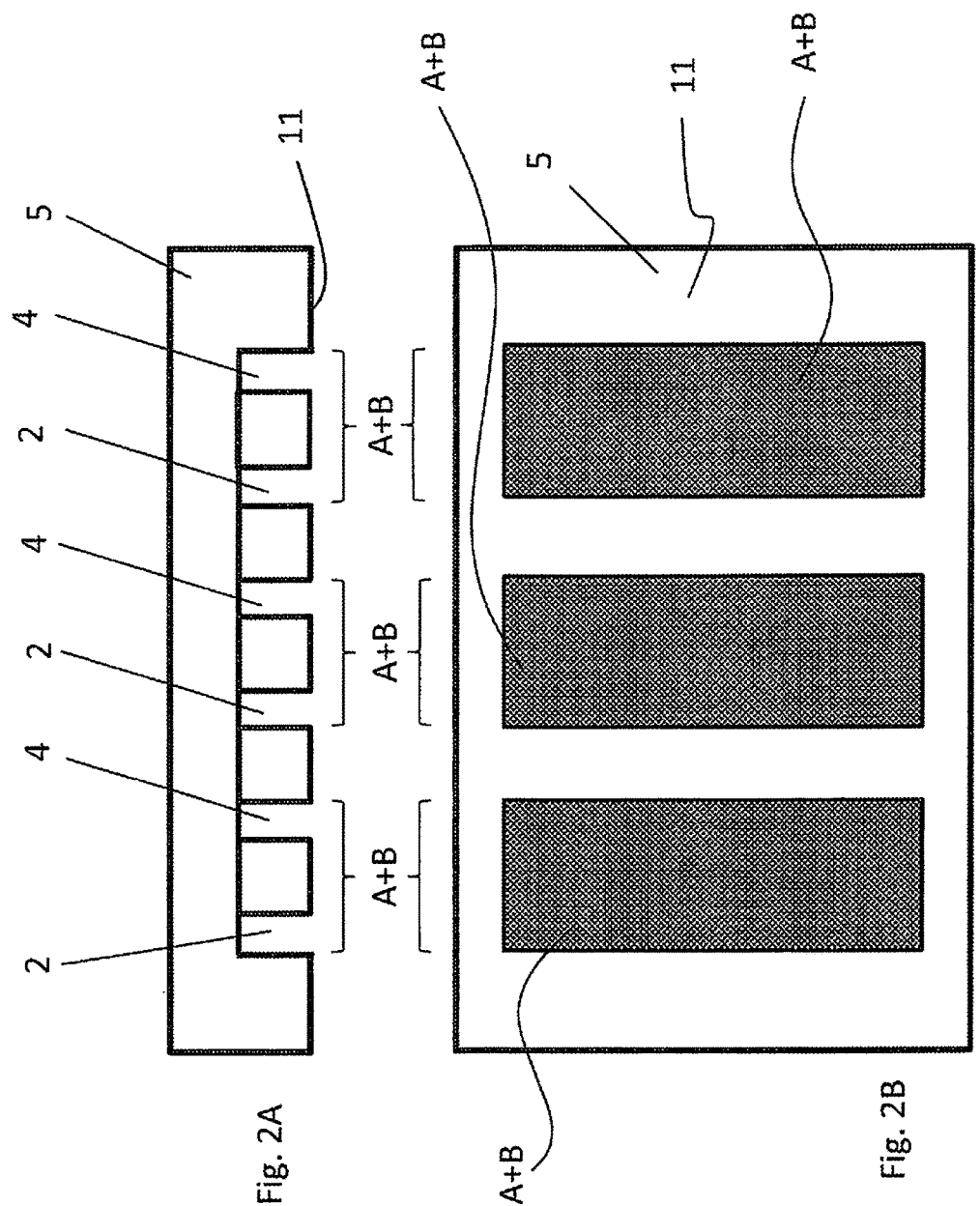
FIGS. 2A and 2B are another schematic view of the prior art nozzle head of FIG. 1.

FIG. 2A shows the prior art nozzle head 5 from the side. The nozzle head 5 comprises first precursor zones A+B provided with the first and second precursor nozzles 2, 4 arranged to supply first and second precursors A, B, respectively. Each first precursor zone A+B comprises one or more first and second precursor nozzles 2, 4 arranged alternately to the output face 11 of the nozzle head 5. It should be noted that the nozzle head 5 is shown in the figures only schematically. The nozzle head 5 usually comprises also purge gas nozzles and discharge nozzles provided between the precursor nozzles 2, 4. Purge gas nozzles being arranged to supply purge gas to the surface 3 of the substrate 1 and discharge nozzles being arranged to discharge purge gas and excess precursors from the surface 3 of the substrate 1. Accordingly each precursor zone A+B may also comprise one or more purge gas nozzles and one or more discharge nozzles.

FIG. 2B shows schematically the output face 11 of the prior art nozzle head 5 of FIG. 2A. The output face 11 comprises one or more, in FIG. 3 three, first precursor zones A+B. Each of these precursor zone A+B comprises one or more first and second precursor nozzles 2, 4. Accordingly, in this prior art nozzle head 5 all the first precursor zones A+B are similar, meaning they are arranged to supply the same first and second precursors A, B via the one or more first and second precursor nozzles 2, 4 and further all the first precursor zones A+B have identical dimensions on the output face 11 of the nozzle head 5. Thus all the first precursor zones A+B provide similar or identical coating first layers AB on the surface 3 of the substrate 1.

Figure 3:
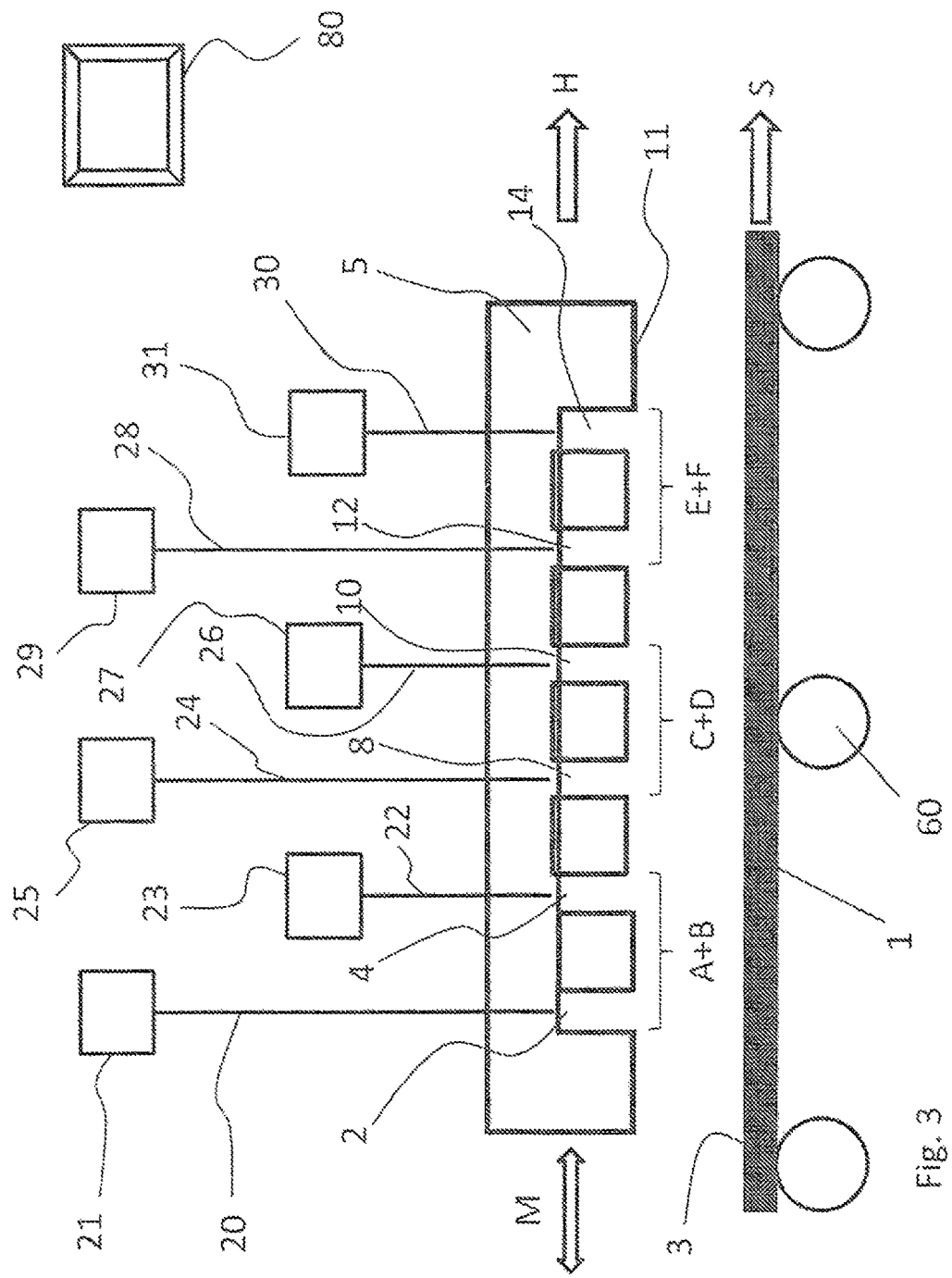
FIG. 3 is a schematic view of one embodiment of a nozzle head and apparatus according to the present invention.

FIG. 3 shows an apparatus and nozzle head 5 according to one embodiment of the present invention. The nozzle head 5 comprises at least two different precursor zones, in this embodiment there is three different precursor zones A+B, C+D, E+F. The output face 11 of the nozzle head 5 comprises one or more first precursor zones A+B provided to the output face 11 of the nozzle head 5 and arranged to supply at least two precursors A, B to the surface 3 of the substrate 1 for forming a first coating layer AB on the surface 3 of the substrate 1. The output face 11 of the nozzle head 5 further also comprises one or more second precursor zones C+D provided to the output face 11 of the nozzle head 5 and arranged to supply at least two precursors C, D to the surface 3 of the substrate 1 for forming a second coating layer CD on the surface 3 of the substrate 1. The second coating layer CD being different from the first coating layer AB. The output face 11 of the nozzle head 5 further also comprises one or more third precursor zones E+F provided to the output face 11 of the nozzle head 5 and arranged to supply at least two precursors E, F to the surface 3 of the substrate 1 for forming a third coating layer EF on the surface 3 of the substrate 1. The third coating layer EF being different from the first coating layer AB and the second coating layer CD.

According to the above mentioned the nozzle head 5 comprises two or more different precursor zones A+B, C+D, E+F which provide different coating layers AB, CD, EF on the surface 3 of the substrate 1. In this embodiment the different precursor zones A+B, C+D, E+F are arranged to supply different precursors A, B, C, D, E, F. As shown in FIG. 3, the one or more first precursor zones A+B are provided to the output face 11 of the nozzle head 5 and arranged to supply at least a first precursor A and a second precursor B to the surface 3 of the substrate 1 for forming the first coating layer AB on the surface 3 of the substrate 1. The one or more second precursor zones C+D are provided to the output face 11 of the nozzle head 5 and arranged to supply at least third precursor C and fourth precursor D to the surface 3 of the substrate 1 for forming a second coating layer CD on the surface 3 of the substrate 1. Furthermore, the one or more third precursor zones E+F are provided to the output face 11 of the nozzle head 5 and arranged to supply at least fifth precursor E and sixth precursor F to the surface 3 of the substrate 1 for forming a third coating layer EF on the surface 3 of the substrate 1.

A shown in FIG. 3, the first precursor zone A+B comprises at least one first precursor nozzle 2 and at least one second precursor nozzle 4 for subjecting the surface 3 of the substrate 1 to successive surface reactions of the first precursor A and the second precursor B for forming the first coating layer AB on the surface 3 of the substrate 1. The second precursor zone C+D comprises at least one third precursor nozzle 8 and at least one fourth precursor nozzle 10 for subjecting the surface 3 of the substrate 1 to successive surface reactions of the third precursor C and the fourth precursor D for forming the second coating layer CD on the surface 3 of the substrate 1. Furthermore, the third precursor zone E+F comprises at least one fifth precursor nozzle 12 and at least one sixth precursor nozzle 14 for subjecting the surface 3 of the substrate 1 to successive surface reactions of the fifth precursor E and the sixth precursor F for forming the third coating layer EF on the surface 3 of the substrate 1. In the embodiments of the present application the precursor nozzles 2, 4, 8, 10, 12, 14 are shown as longitudinal nozzles or openings provided to the output face 11, however they may also be of different shape and dimensions.

The apparatus of FIG. 3 may comprise similar moving system as described in connection with FIG. 1. The apparatus further comprises precursor supply system comprising precursor sources, conduits, pumps and valves for delivering precursors. As shown in FIG. 3, the precursor supply system comprises precursor sources 21, 23, 25, 27, 29, 31 for precursors A, B, C, D, E, F respectively, and precursor conduits 20, 22, 24, 26, 28, 30 respectively provided between the precursor sources 21, 23, 25, 27, 29, 31 and the precursor nozzles 2, 4, 8, 10, 12, 14. The precursor system may further be provided with pumps (not shown) and valves for feeding the precursors from the first, second, third, fourth, fifth and sixth precursor source 21, 23, 25, 27, 29, 31 to the precursor nozzles 2, 4, 8, 10, 12, 14. The apparatus further comprises a control system 80. The control system 80 may be arranged to control the coating process by simultaneously controlling the operation of the precursor system and the moving system of the apparatus. The control system 80 may comprise several different electrical components, a control unit, such as a computer or microprocessor using control software, and other necessary components. The control system can be operatively connected to the moving system and the precursor supply system.

The moving system may be arranged to move the substrate 1 one or more times past the output face 11 of the nozzle head 5 by moving the nozzle head 5 and the substrate relative to each other. Alternatively the nozzle head 5 may be arranged to move reciprocating movement over the surface 3 of the substrate 1. The reciprocating movement may also be combined with linear translation movement.

Relating to the above mentioned it should be noted, that each precursor A, B, C, D, E and F may be different precursors. However, in some one precursor in at least two or in all different precursor zones A+B, C+D, E+F may be a same precursor and the other precursor may be different. This means that for example the second, fourth, and sixth precursor nozzles 4, 10, 14 may be arranged to supply same precursor and the first, third and fifth precursor zones 2, 8, 12 different precursor materials for forming different coating layers AB, CD, EF on the surface 3 of the substrate 1. For example, the at least one first precursor nozzle 2 and the at least one second precursor nozzle 4 of the first precursor zone A+B may be arranged to supply first and second precursors A, B, respectively, and that the at least one third precursor nozzle 8 and the at least one fourth precursor nozzle 10 of the second precursor zone C+D may be arranged to supply third and fourth precursors C, D, respectively. In this example, the first, second, third and fourth precursors A, B, C, D may be different precursors or alternatively the first and third precursors A, C are different precursors, and the second and fourth precursor B, D are same precursors, and different than the first and third precursors A, C. Thus the produced first and second coating layers AB and CD are different as the first and third precursors A, C are different precursors. Furthermore, it should be noted that different precursors A, B, C, D, E, F may also be supplied from one precursor nozzle 2, 4, 8, 10, 12, 14 in an alternating manner or simultaneously using a precursor mixture.

The precursors A, B, C, D, E, F, or at least one of the precursors A, B, C, D, E, F, may be supplied with the precursor supply system via the precursor nozzles 2, 4, 8, 10, 12, 14 continuously. Alternatively the precursors A, B, C, D, E, F, or at least one of the precursors A, B, C, D, E, F, may be supplied in pulsed manner with the precursor supply system via the precursor nozzles 2, 4, 8, 10, 12, 14. The precursor supply may also the carried out with the precursor supply system such that one or more precursors A, B, C, D, E, F is supplied continuously and at the same time one or more precursors A, B, C, D, E, F is supplied in pulsed manner.

Figure 4:
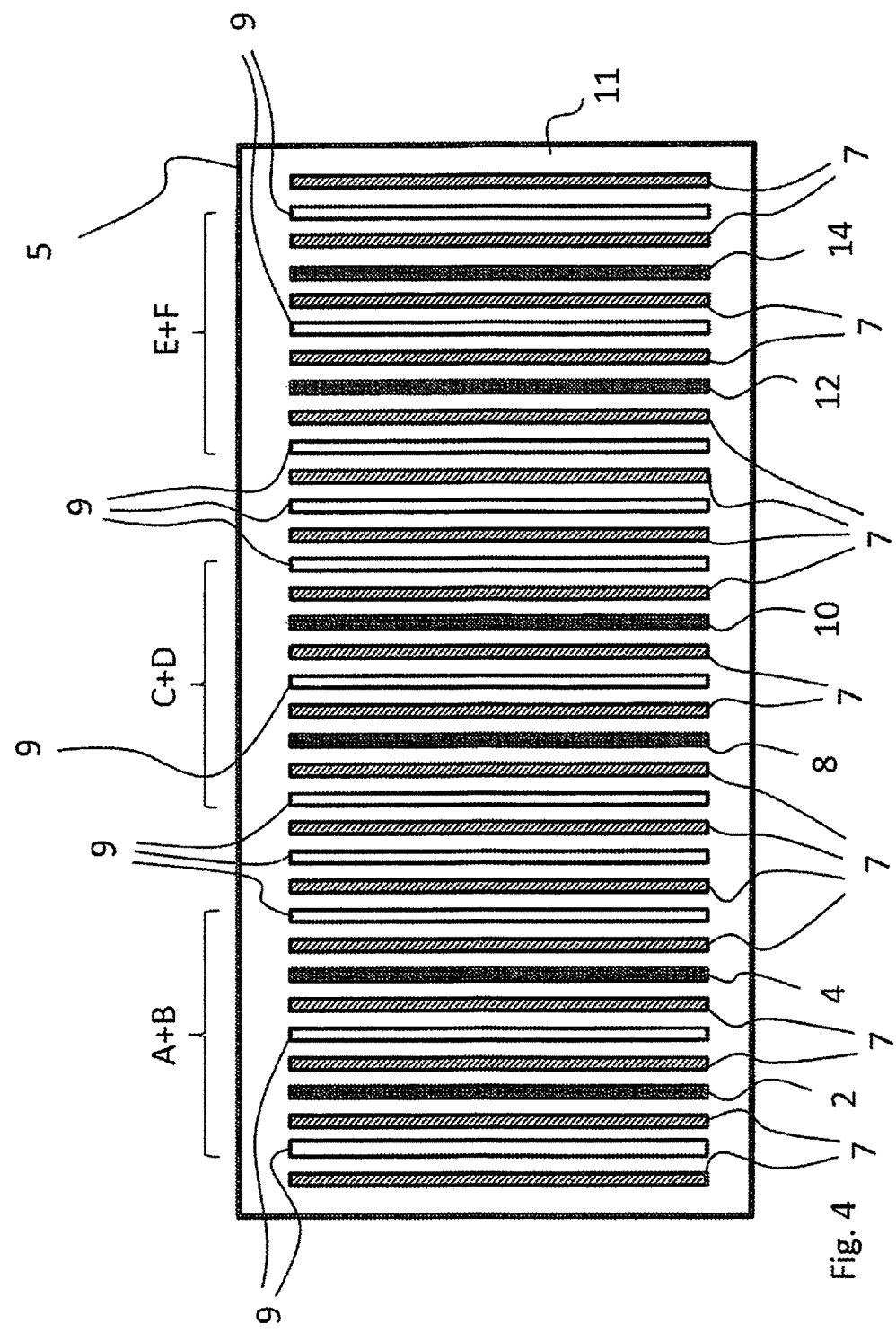
FIG. 4 is a schematic view of an output face of the nozzle head of FIG. 3.

FIG. 4 shows schematically one embodiment of an output face 11 of the nozzle head 5 comprising different precursor zones A+B, C+D, E+F according to one embodiment of the present invention. As may be seen from FIG. 4, the output face 11 comprises discharge nozzles 7 and purge gas nozzles 9 in addition to the precursor nozzles 2, 4, 8, 10, 12, 14 for separating the precursor zones A+B, C+D, E+F from each other. The discharge nozzle 7 may be connected to a discharge pump (not shown) for discharging or sucking precursors A, B, C, D, E, F from the surface 3 of the substrate 1. It should be noted that the purge gas nozzles 9 may also be omitted. The purge gas nozzles 9 may be connected to a purge gas source (not shown) for delivering the purge gas to the purge gas nozzle 9. All the nozzles are shown as longitudinal nozzles or openings provided to the output face 11 of the nozzle head 5, however they may also be of different shape and dimensions. The precursor zones A+B, C+D, E+F are shown with parenthesis in FIG. 4. According to FIG. 4 the nozzle head 5 comprises at least one discharge nozzle 7 provided to the output face 11 between adjacent precursor zones A+B, C+D, E+F for discharging precursors A, B, C, D, E, F. Alternatively at least one discharge nozzle 7 may be provided to the output face 11 between different precursor zones A+B, C+D, E+F, for example between the first precursor zone A+B and the second precursor zone C+D for discharging precursors, when there are two or more similar precursor zones A+B, C+D, E+F arranged adjacently. In a similar manner the nozzle head 5 comprises at least one purge gas nozzle 9 provided to the output face 11 between adjacent precursor zones A+B, C+D, E+F for supplying purge gas. Alternatively at least one purge gas nozzle 9 may be provided to the output face 11 between different precursor zones A+B, C+D, E+F, for example between the first precursor zone A+B and the second precursor zone C+D, for supplying purge gas, when there are two or more similar precursor zones A+B, C+D, E+F arranged adjacently.

According to the embodiment of FIG. 4, the precursor zones A+B, C+D, E+F may further comprise one or more discharge nozzles 7 and/or one or more purge gas nozzles 9 for separating the precursors A, B, C, D, E, F and precursor nozzles 2, 4, 8, 10, 12, 14 from each other. The precursor zones A+B, B+C, E+F may comprises at least one discharge nozzle 7 and/or at least one purge gas nozzle 9 provided to the output face 11 and between the precursor nozzles 2, 4, 8, 10, 12, 14 of the precursor zone A+B, B+C, E+F. In one embodiment the one or more first precursor zones A+B comprises at least one discharge nozzle 7 provided to the output face 11 and between the first and second precursor nozzles 2, 4, and/or the one or more second precursor zones C+D comprises at least one discharge nozzle 7 provided to the output face 11 and between the third and fourth precursor nozzles 8, 10, and/or the one or more third precursor zones E+F comprises at least one discharge nozzle 7 provided to the output face 11 and between the fifth and sixth precursor nozzles 12, 14. In the similar manner in one embodiment the one or more first precursor zones A+B comprises at least one purge gas nozzle 9 provided to the output face 11 and between the first and second precursor nozzles 2, 4, and/or the one or more second precursor zones C+D comprises at least one purge gas nozzle 9 provided to the output face 11 and between the third and fourth precursor nozzles 8, 10, and/or the one or more third precursor zones E+F comprises at least one purge gas nozzle 9 provided to the output face 11 and between the fifth and sixth precursor nozzles 12, 14. The precursor zones A+B, B+C, E+F may also comprise one or more purge gas nozzles 9 and discharge nozzles 7 provided to the edge region of the precursor zones A+B, C+D, E+F, meaning outer side of the outermost precursor nozzles 2, 4, 8, 10, 12, 14, as shown in FIG. 4. In the embodiment of FIG. 4 each precursor zones A+B, C+D, E+F comprises between precursor nozzles 2, 4, 8, 10, 12, 14 a discharge nozzle 7, purge gas nozzle 9 and a discharge nozzle 7.

FIGS. 5A and 5B shows schematically a simplified view of the nozzle head 5 and output face 11 of the nozzle head FIG. 4 according to one embodiment of the present invention. The nozzle head 5 comprises the first precursor zone A+B, the second precursor zone C+D and the third precursor zone E+F provided to the output face 11. The output face 11 comprises the first, second and third precursor zone A+B, C+D, E+F adjacently to each other. it should be noted that the output face 11 may also comprise two or more of each precursor zone A+B, C+D, E+F and the order of the precursor zones A+B, C+D, E+F altered. According to the present invention the output face 11 comprises at least two different precursor zones A+B, C+D, E+F.

FIGS. 6A, 6B and 6C show different coatings provided with the nozzle head 5 of FIGS. 3, 4, 5A and 5B depending on the operating mode of the apparatus, moving the nozzle head 5 relative to the substrate 1 and supplying the precursors according to one embodiment of the present invention. In 6A the apparatus and nozzle head 5 are arranged to form three superposed coating layers AB, CD and EF of different coating materials on the substrate 1. In FIG. 6B the apparatus and nozzle head 5 are arranged to form three adjacent coating layers AB, CD and EF of different coating materials on the substrate 1. In FIG. 6C the apparatus and nozzle head 5 are arranged to form three different nanolaminate layers (here, three layers are shown for brevity, nanolamiates usually comprise hundreds of layers of at least two different alternating materials) each of which comprises superposed coating layers AB, CD and EF of different coating materials on the substrate 1. The apparatus and nozzle head 5 may be arranged to form numerous different coatings depending on the operating mode and the construction of the nozzle head 5.

In one operating mode of the present invention the control system 80 may be arranged to introduce or feed precursors A, B, C, D, E, F by controlling the precursor supply system and simultaneously move the nozzle head 5 relative to the substrate 1 by controlling the moving system M, H, S such that only the one or more limited sub-areas are subjected to two different precursors A, B, C, D, E, F of the corresponding precursor zone A+B, C+D, E+F. In other words at least one of the first and second precursor are supplied such that the both or at least two of the precursors A, B, C, D, E, F of one precursor zone A+B, C+D, E+F are supplied to the surface 3 of the substrate 1 only on the limited sub-areas of the surface 3. Supplying the precursors may be carried out such that precursors are supplied only when the precursor nozzle is over the predetermined limited sub-area of the surface of the substrate.

Accordingly, the apparatus may further comprise a control system 80 for controlling the coating process. The control system 80 may be arranged to control the precursor supply system 20, 21, 22, 23, 24, 25, 26, 27, 28, 29 and the moving system H, M, S in co-operation for providing one or more coating layers AB, CD, EF on one or more first limited sub-areas of the surface 3 of the substrate 1 and leaving one or more second limited sub-areas without coating layers by synchronised supply of the precursors A, B, C, D, E, F from the precursor nozzles 2, 4, 8, 10, 12, 14, respectively, and simultaneous movement of the nozzle head 5 relative to substrate 1.

Figure 7:
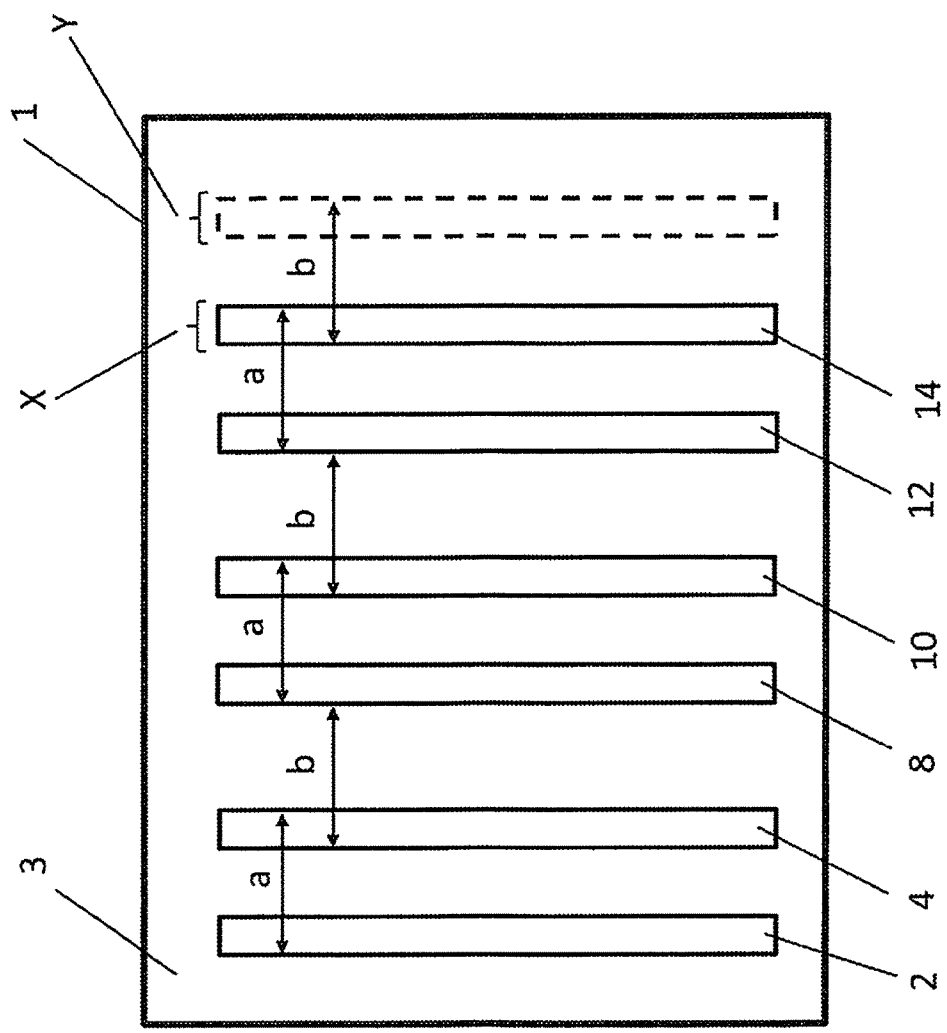
FIG. 7 is a schematic view of moving the nozzle head over a surface of a substrate.

FIG. 7 shows schematically an embodiment of the present invention in which the substrate 1 is moved relative to the nozzle head 5 such that the movements of the precursor nozzles 2, 4, 8, 10, 12, 14 of one precursor zone A+B, C+D, E+F over the surface 3 of the substrate 1 are overlapped only on the first limited sub-areas of the surface 3 of the substrate 1 for providing one or more coating layers on the first limited sub-areas. In other words the precursor supply is not introduced intermittently, but the precursors are supplied continuously from the first and second precursor nozzle 2, 4. As shown in FIG. 7 the substrate 1 and the nozzle head 5 are moved in reciprocating, or oscillating, movement in relation to the substrate 1 between a first relative position X and a second relative position Y over the surface 3 of the substrate 1 such that the reciprocating movements of the first precursor nozzle 2 and the second precursor nozzle 4 of the first precursor zone A+B (third precursor nozzle 8 and fourth precursor nozzle 10 of the second precursor zone C+D; fifth precursor nozzle 12 and sixth precursor nozzle 14 of the third precursor zone E+F) are overlapped on the first limited sub-areas over the surface 3 of the substrate 1. The nozzle head 5, and thus the precursor nozzles 2, 4, 8, 10, 12, 14, is moved in reciprocating movement a distance a, b between the first relative position X and the second relative position Y. The relative positions X and Y are shown only for the sixth precursor nozzle 14 on the right in FIG. 7. The first relative position X may be starting position and the second relative position Y, shown in dotted lines, the end position of the reciprocating movement. In the reciprocating movement the adjacent precursor nozzles 2, 4, 8, 10, 12, 14 of each precursor zone A+B, C+D, E+F overlap on the first limited sub-areas. As shown in FIG. 7 the coating is formed only on the first limited sub-areas in which the movements of the adjacent precursor nozzles 2, 4, 8, 10, 12, 14 of each precursor zone A+B, C+D, E+F are overlapped on the surface 3 of the substrate 1, meaning areas where the arrows b of adjacent precursor nozzles 2, 4, 8, 10, 12, 14 are overlapped in FIG. 7. In other words the movement of nozzle head 5 cause the deposition of the both precursors of the precursor zone A+B, C+D, E+F only on the first limited sub-areas of the surface 3 of the substrate 1.

In the embodiment of FIG. 7 the nozzle head 5 is moved in reciprocating movement in relation to the substrate 1 between a first relative position X and a second relative position Y over the surface 3 of the substrate 1 such that the second relative position Y of one precursor nozzle 2, 8, 12 substantially overlaps the first relative position X of the adjacent precursor nozzle 4, 10, 14 during the reciprocating movement for subjecting the surface 3 of the substrate 1 to two different precursors at the one or more first limited subareas provided by the overlapped regions of the first and second relative positions X, Y. Thus the shape of the precursor nozzles 2, 4, 8, 10, 12, 14 have an effect on the shape of the coated first limited sub-areas. The nozzle head 5 may also be moved in reciprocating movement in relation the substrate 1 between a first relative position X and a second relative position Y over the surface 3 of the substrate 1 such that the second relative position Y of one precursor nozzle 2, 8, 12 only partly overlaps the first relative position X of the adjacent precursor nozzle 4, 10, 14. Thus differently coated first limited subareas may be formed. By adjusting the distance of the movement a, b of the nozzle head 5, the length of the coated limited sub-areas may be adjusted. In the present application the term length refers to the relative moving direction of the substrate 1 in relation to the nozzle head 5. This means that the length direction is the moving direction of the substrate 1 relative to the nozzle head 5 or the moving direction of the nozzle head 5 relative to the substrate 1. Similarly, the width refers to a direction substantially perpendicular to the relative moving direction of the substrate 1 in relation to the nozzle head 5. This means that the width direction is the direction perpendicular to the moving direction of the substrate 1 relative to the nozzle head 5 or the moving direction of the nozzle head 5 relative to the substrate 1.

In an embodiment in which the substrate 1 is a longitudinal web, strip, plate or the like, the length may also extend in the longitudinal direction of the substrate 1 and the width extends in the transverse or perpendicular direction to the longitudinal direction of the substrate 1. In other words the length direction may be the longitudinal direction of the substrate 1 and the width direction perpendicular to the longitudinal direction of the substrate. Further, in this case the nozzle head 5 is moved in the longitudinal direction of the substrate 1.

Figure 8:
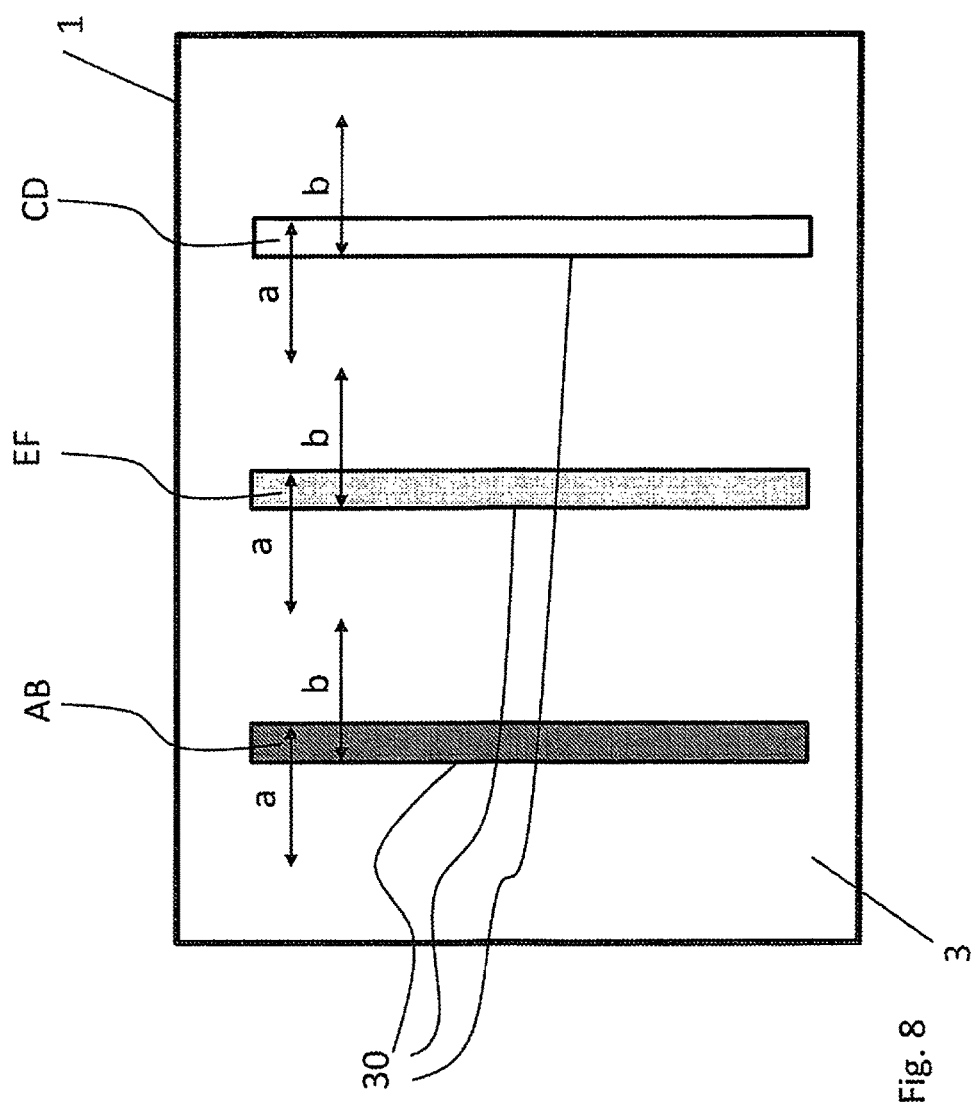
FIG. 8 is a schematic view of coating layers provided moving the nozzle according to FIG. 7.

FIG. 8 shows the coated first limited sub-areas 20 formed by the apparatus according to one embodiment of the present invention, nozzle head 5 and operating mode and method being described in connection with FIG. 7. FIG. 8 clearly demonstrates that the coating is formed only on the limited sub-areas 20 where the reciprocating movement, distance a, b, of the precursor nozzles 2, 4, 8, 10, 12, 14 of each precursor zone A+B, C+D, E+F are overlapped over the surface 3 of the substrate 1. The surface 3 of the substrate 1 is thus subjected to both precursor of the precursor zone A+B, C+D, E+F only on these overlapped sub-areas 30 where the reciprocating movements of the precursor nozzles 2, 4, 8, 10, 12, 14 of the precursor zone A+B, C+D, E+F are overlapped. In this embodiment the limited first sub-areas are stripes, but alternative they may be any geometrical or predetermined shapes. This is achieved by moving the nozzle head 5 and simultaneously supplying the precursors via the precursor nozzles 2, 4, 8, 10, 12, 14.

As shown in FIGS. 7 and 8, the nozzle head 5 has three different precursor zones A+B, C+D, E+F and thus three different coating layers AB, CD, EF are formed on the limited sub-areas 30 of the surface 3 of the substrate 1 as the movement a, b of the precursor nozzles 2, 4, 8, 10, 12, 14 of the precursor zones A+B, C+D, E+F are overlapped.

In an alternative embodiment the nozzle head 5 may be moved in relation to the substrate 1 along a curved or a loop coating path over the surface 3 of the substrate 1 by controlling the moving system such that in the curved coating path the precursor nozzles 2, 4, 8, 10, 12, 14 of the precursor zones A+B, C+D, E+F are overlapped.

According to the above mentioned control system 80 may be arranged to move the nozzle head 5 relative to the substrate 1 by controlling the moving system H, M, S such that the movements of the first precursor nozzle 2 and the second precursor nozzle 4 over the surface 3 of the substrate 1 are overlapped only on the first limited sub-areas 30 of the surface 3 of the substrate 1 for providing one or more coating layers AB on the first limited subareas 30, and/or the movements of the third precursor nozzle 8 and the fourth precursor nozzle 10 over the surface 3 of the substrate 1 are overlapped only on the first limited sub-areas 30 of the surface 3 of the substrate 1 for providing one or more coating layers CD on the first limited sub-areas 30, and/or the movements of the fifth precursor nozzle 12 and the fourth precursor nozzle 14 over the surface 3 of the substrate 1 are overlapped only on the first limited sub-areas 30 of the surface 3 of the substrate 1 for providing one or more coating layers EF on the first limited sub-areas 30.

The different precursor zones A+B, C+D and E+F may alternatively, or additionally, be provided by precursor zones A+B, C+D, E+F having different dimensions or shapes in the output face 11 of the nozzle head 5. This means that different coating layers AB, CD, EF may be formed by supplying the same precursors A, B, C, D, E, F from all of the precursor nozzles 2, 4, 8, 10, 12, 14 and precursor zones A+B, C+D, E+F. In this case the difference between the formed coating layers is in the different dimensions of shape of the produced coating layers AB, CD, EF. This is achieved by providing a nozzle head 5 having at least two precursor zones A+B, C+D, E+F having different dimensions or shapes. However, it should be noted the precursor zones A+B, C+D, E+F having different dimensions may also be arranged to supply different precursors A, B, C, D, E, F, as described in connection with FIGS. 3 to 9.

According to the above mentioned, all of the one or more first precursor zones A+B may have identical dimensions on the output face 11 of the nozzle head 5, and/or all of the one or more second precursor zones C+D may have identical dimensions on the output face 11 of the nozzle head 5, and/or all of the one or more third precursor zones E+F may have identical dimensions on the output face 11 of the nozzle head 5. Alternatively, at least two of the first precursor zones A+B have different dimensions on the output face 11 of the nozzle head 5, and/or at least two of the second precursor zones C+D have different dimensions on the output face 11 of the nozzle head 5, and/or at least two of the third precursor zones E+F have different dimensions on the output face 11 of the nozzle head 5.

In one embodiment all the first, second and third precursor zones A+B, C+D, E+F may have identical dimensions on the output face 11 of the nozzle head 5, or the one or more second precursors zones C+D may have different dimensions on the output face 11 of the nozzle head 5 than the one or more first precursor zones A+B and/or the one or more third precursor zones E+F. Alternatively at least one of the one or more second precursor zones C+D may have different dimensions on the output face 11 of the nozzle head 5 than the one or more first precursor zones A+B and/or one or more third precursor zones E+F.

As the precursor zones A+B, C+D, E+F may have different dimensions or shapes on the output face 11, also the precursor nozzles 2, 4, 8, 10, 12, 14 may have different dimensions or shapes on the output face 11. In one embodiment all of the at least one first and second precursor nozzles 2, 4 of the first precursor zone A+B have identical dimensions on the output face 11 of the nozzle head 5, and/or all of the at least one third and fourth precursor nozzles 8, 10 of the second precursor zone C+D have identical dimensions on the output face 11 of the nozzle head 5, and/or all of the at least one fifth and sixth precursor nozzles 12, 14 of the third precursor zone E+F have identical dimensions on the output face 11 of the nozzle head 5. Alternatively at least two of the at least one first and second precursor nozzles 2, 4 of the first precursor zone A+B have different dimensions on the output face 11 of the nozzle head 5, and/or at least two of the at least one third and fourth precursor nozzles 8, 10 of the second precursor zone C+D have different dimensions on the output face 11 of the nozzle head 5, and/or at least two of the at least one fifth and sixth precursor nozzles 12, 14 of the third precursor zone E+F have different dimensions on the output face 11 of the nozzle head 5. In another embodiment all of the at least one first, second, third, fourth, fifth and sixth precursor nozzles 2, 4, 8, 10, 12, 14 have identical dimensions on the output face 11 of the nozzle head 5, or the at least one first and second precursor nozzles 2, 4 have different dimensions on the output face 11 of the nozzle head 5 than the at least one third and fourth precursor nozzles 8, 10, and/or the fifth and sixth precursor nozzles 12, 14.

Figure 9:
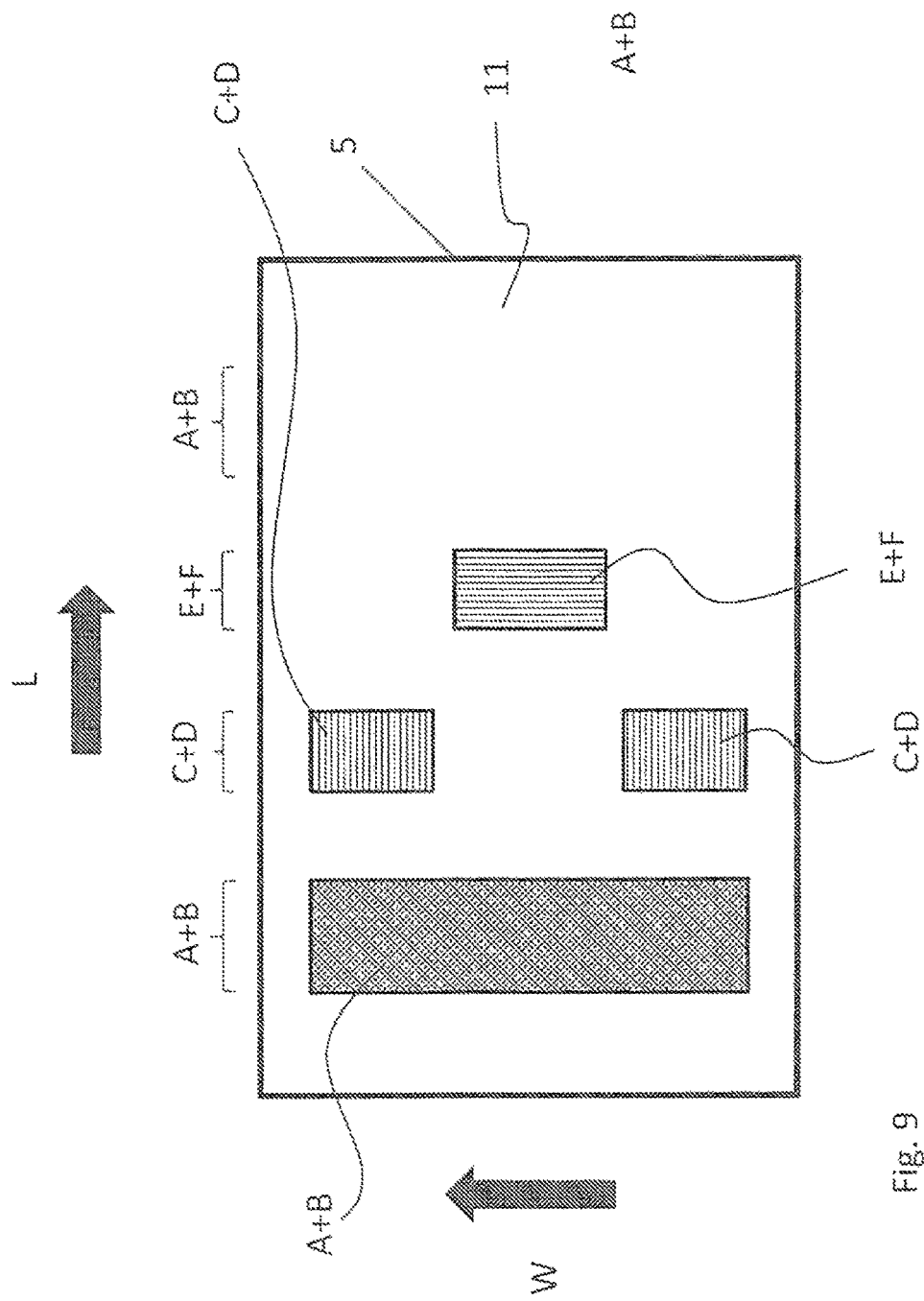
FIG. 9 is a schematic view of another embodiment of a nozzle head according to the present invention.
Figure 10:
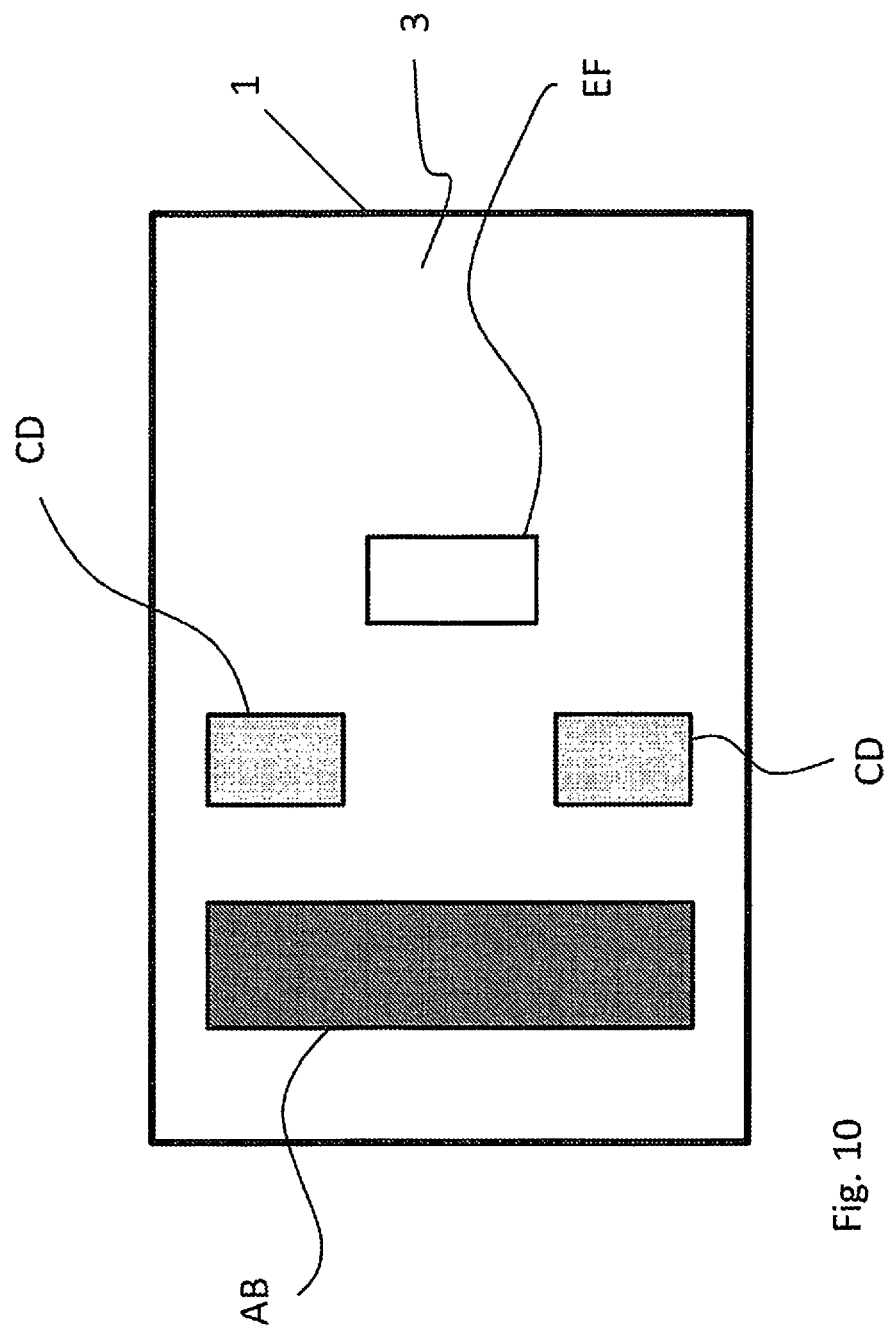
FIG. 10 is a schematic view of coating layers provided moving the nozzle according to FIG. 9.
Figure 11:
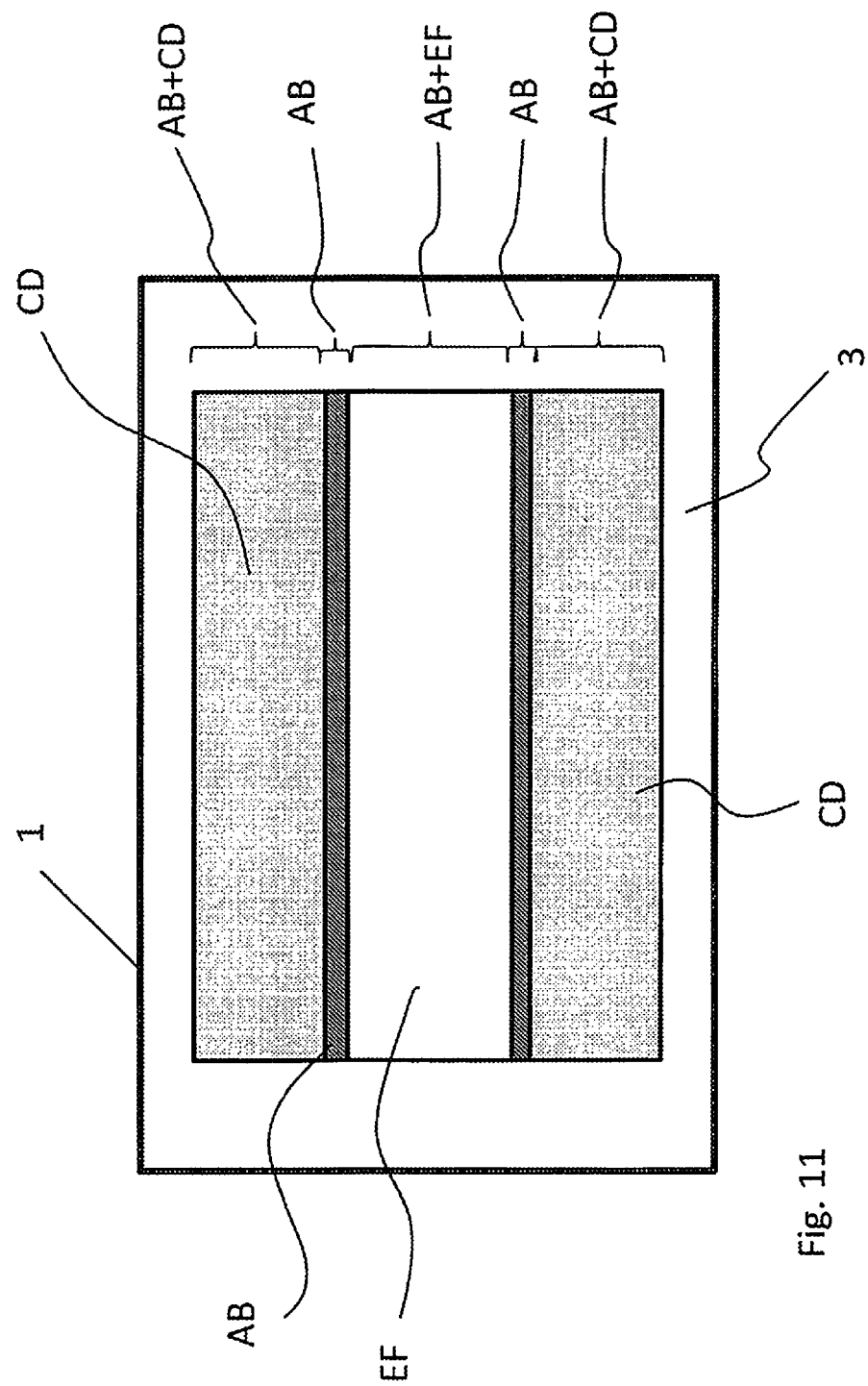
FIG. 11 is another schematic view of coating layers provided moving the nozzle according to FIG. 9

FIG. 9 shows one embodiment of a nozzle head 5 having three different precursor zones A+B, C+D, E+F provided to the output face 11 of the nozzle head 5. The output face 11 has a length L and a width W. The length L of the output face 11 extends in the relative moving direction H, M, S of the nozzle head 5 and the substrate 1. The width W of the output face 11 extends perpendicularly or transversely to the relative moving direction H, M, S of the nozzle head 5 and the substrate 1. The different precursor zones A+B, C+D, E+F have different shapes or dimensions and thus they produce different coating layers on the surface 3 of the substrate, as shown in FIGS. 10 and 11. The first precursor zone A+B forms a large area first coating layer AB, and the second precursor zone C+D forms on the edges of the first coating layer AB a second coating layer CD and the third precursor zone E+F forms on the centre of the first coating layer AB of third coating layer EF. It should be noted all or at least one of the different precursor zones A+B, C+D, E+F may be arranged to supply different precursors A, B, C, D, E, F than the other precursor zones A+B, C+D, E+F.

Furthermore, in the case of precursor nozzles 2, 4, 8, 10, 12, 14 the term width means the longitudinal direction or longitudinal dimension of the precursor nozzle 2, 4, 8, 10, 12, 14. Similarly, in the case of precursor nozzles 2, 4, 8, 10, 12, 14 the term length means the direction perpendicular to the longitudinal direction or longitudinal dimension of the precursor nozzles 2, 4, 8, 10, 12, 14. The longitudinal direction of the precursor nozzles 2, 4, 8, 10, 12, 14 extends perpendicular to the relative moving direction of the nozzle head 5 and the substrate 1.

According to FIG. 9 the precursor zones A+B, C+D, E+F have different dimensions or shapes. The precursor zones may have different widths, width being the dimension perpendicular to the relative movement of the substrate 1 to the nozzle head 5 along the substrate surface, and/or different lengths, length being the dimension parallel to the relative movement of the substrate 1 to the nozzle head 5. As shown in FIG. 9, the first precursor zone A+B extends substantially along the whole width W of the output face 11, while the second and third precursor zones C+D, E+F extend only along a part of the width W, of the output face 11. Thus the width of the first precursor zone A+B is different than the width, or shape, in the width direction W of the output face 11, of the second and third precursor zone C+D, E+F and further the width, or shape in the width direction W of the output face 11, of the second precursor zone C+D is different than the width, or shape in the width direction W of the output face 11, of the third precursor zone E+F. The area of the first precursor zone A+B may thus be larger or smaller than the area of the second and/or third precursor zone C+D, E+F. Accordingly the first and second precursor nozzles 2, 4 of the first precursor zone A+B may have different width, longitudinal dimension, or shape in the width direction W of the output face 11, than the third and fourth precursor nozzle 8, 10 of the second precursor zone C+D and or the fifth and sixth precursor nozzle 12, 14 of the third precursor zone E+F. Thus the first and second precursor nozzle 2, 4 of the first precursor zone A+B may extend substantially along the whole width W, of the output face 11, while the third, fourth, fifth and sixth precursor nozzle 8, 10, 12, 14 of the second and third precursor zones C+D, E+F may extend only along a part of the width W of the output face 11.

In an alternative embodiment the length, in addition or instead of the width, of the first precursor zone A+B is different than the length, or shape in the length direction L of the output face 11, of the second and third precursor zone C+D, E+F and further the length, or shape in the length direction L of the output face 11, of the second precursor zone C+D is different than the length, or shape in the length direction L of the output face 11, of the third precursor zone E+F. The area of the first precursor zone A+B may thus be larger or smaller than the area of the second and/or third precursor zone C+D, E+F. Accordingly the first and second precursor nozzles 2, 4 of the first precursor zone A+B may have different length, dimension perpendicular to the longitudinal direction, or shape in the length direction L of the output face 11, than the third and fourth precursor nozzle 8, 10 of the second precursor zone C+D and or the fifth and sixth precursor nozzle 12, 14 of the third precursor zone E+F.

The precursor zones A+B, C+D, E+F may also be located on different positions on the output face 11, as shown in FIG. 9. Thus the differently located precursor zones A+B, C+D, E+F may provide coating layers AB, CD, EF on different locations of the surface 3 of the substrate 1.

The output face 11 of the nozzle head comprises at least two second precursor zones C+D arranged at different locations on the output face 11 of the nozzle head 5 in the direction of the width W of the output face 5. The second precursor zones have length in the direction of the with W less than the width W of the output face. As, shown in FIG. 9, second precursor zones C+D are arranged adjacently to each other or in line on the output face 11 of the nozzle head 5 in the direction of the width W of the output face 5. In this embodiment the length of the second precursor zone is less than half of the width W of the output face 11.

In an alternative embodiment the precursor zones C+D, E+F may be arranged at different locations on the output face 11 of the nozzle head 5 in the direction of the width W of the output face 5 and at different locations on the output face 11 of the nozzle head 5 in the direction of the length L of the output face 5. As shown in FIG. 9, second precursor zones C+D and the third precursor zone E+F are arranged on the output face at different locations on the output face 11 of the nozzle head 5 in the direction of the width W of the output face 5 and at different locations on the output face 11 of the nozzle head 5 in the direction of the length L of the output face 5. It should be noted that also one second precursor zone C+D may be omitted or it maybe arranged at different locations on the output face 11 of the nozzle head 5 in the direction of the length L of the output face 5 relative to the other second precursor C+D and the third precursor zone E+F.

The second, or second and third, precursor zones C+D may arranged at least party overlapped in the direction of the length L of the output face 5 and/or at least party overlapped in the direction of the width W of the output face 5. This means that on the overlapped areas in the direction of the width W precursor zones are at least partly in line in the direction of the width W, in extreme case they are adjacent. On the overlapped areas in the direction of the length L precursor zones are at least partly in line in the direction of the length L, in extreme case they are successively in the direction of the length L such that superposed coating layers may be formed.

FIG. 10 shows coating layers AB, CD and EF provided with the nozzle head 5 of FIG. 9. The coating layers AB, CD and EF are only on limited sub-areas of the surface 3 of the substrate and provided with the precursor zones A+B, C+D and E+F of the nozzle head 5 of FIG. 9 using small reciprocating movement of the nozzle head 5 relative to the surface 3 of the substrate. FIG. 11 on the other hand shows coating layers AB, CD and EF provided on the surface 3 of the substrate 1 by moving the nozzle 5 fully over the surface of the substrate 1. Accordingly at the edge portions of the surface 3 there is provided superposed coating layers AB+CD, and in the middle portion of the surface 3 there is provided superposed coating layers AB+EF. Between the edge portion and middle portion of the surface 3 there area with only first coating layer AB. Accordingly, the formation of the coating layers AB, CD, EF may be altered by altering the operating mode of the apparatus and moving system.

Figure 12:
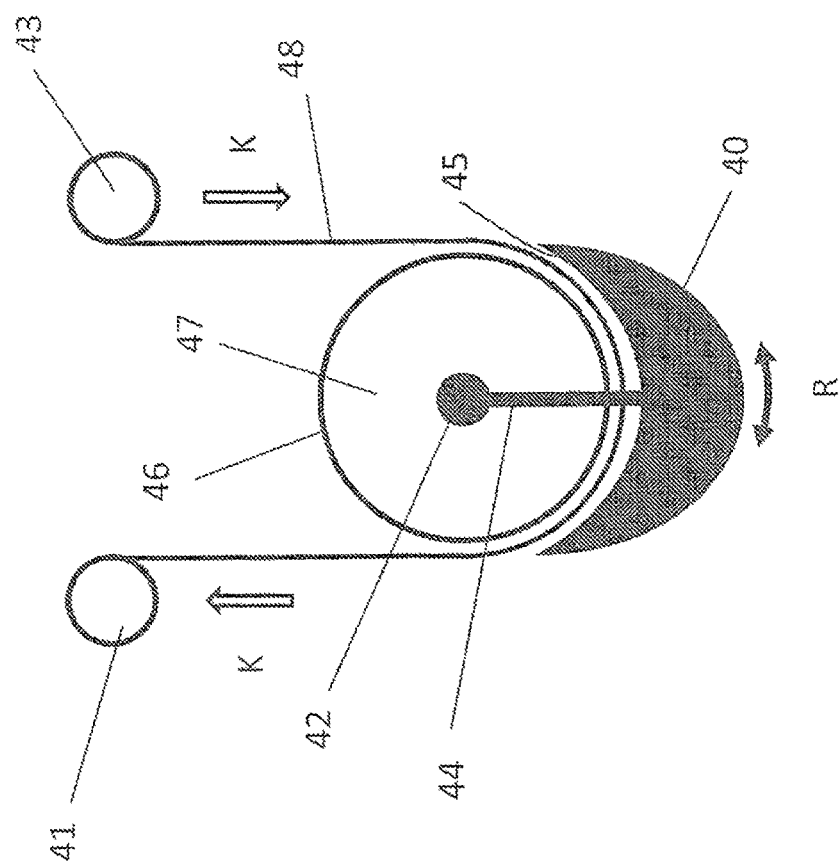
FIG. 12 is a schematic view of another embodiment of an apparatus and nozzle head according to the present invention.

FIG. 12 shows an alternative embodiment of the apparatus according to one embodiment of the present invention in which a substrate 48 is transported with the moving system having substrate moving means in which the substrate 48 is transported on the outer surface 46 of the transport cylinder 47 from a first substrate roll 43 to second substrate roll 41 in direction of arrows K. The substrate 48 may be transported along the outer surface 46 of the transport cylinder 47 by rotating the transport cylinder 47 or separate transport elements on the outer surface 46 with a same speed as substrate 48 is transported. Alternatively the transport cylinder 48 is provided with a slide surface on the outer surface 47 such that the substrate 48 may slide along the outer surface 46 while moving the substrate 48 is carried out by rotating the first and second substrate roll 43, 41. The apparatus is further provided with a nozzle head 40 arranged in connection with the transport cylinder 47. The nozzle head 40 comprises an output face 45 provided with the first and second precursor nozzles, as described above. The output face 45 of the nozzle head 40 is formed conform a portion of a cylindrical outer surface 46, as shown in FIG. 5. The nozzle head 40 is positioned over the substrate 48 and outer surface 46 such that there is gap between the output face 45 and the outer surface 46, transport surface.

The apparatus of FIG. 12 comprises a moving system having nozzle head moving means for moving the nozzle head 40 in relation to the transport cylinder 47 and substrate 48. The moving mechanism is arranged to move the nozzle head 2 in a reciprocating or oscillating swing movement between a first end position and a second end position around the central axis 42 of the transport cylinder 47, as shown with arrow R in FIG. 5. The apparatus of FIG. 5 may be operated in the same three operating modes as the apparatus shown FIGS. 1 to 3. Thus the substrate nozzle head 40 may be stationary in relation to the substrate 48 or it may be moved in reciprocating, or oscillating swing, movement around the axis 42 and the supply of the first and second precursors from the first and second precursor nozzle may be introduced as described above. The nozzle head 40 may be provided with different precursor zones as described in connection with above embodiments of FIGS. 3 to 11.

Figure 13:
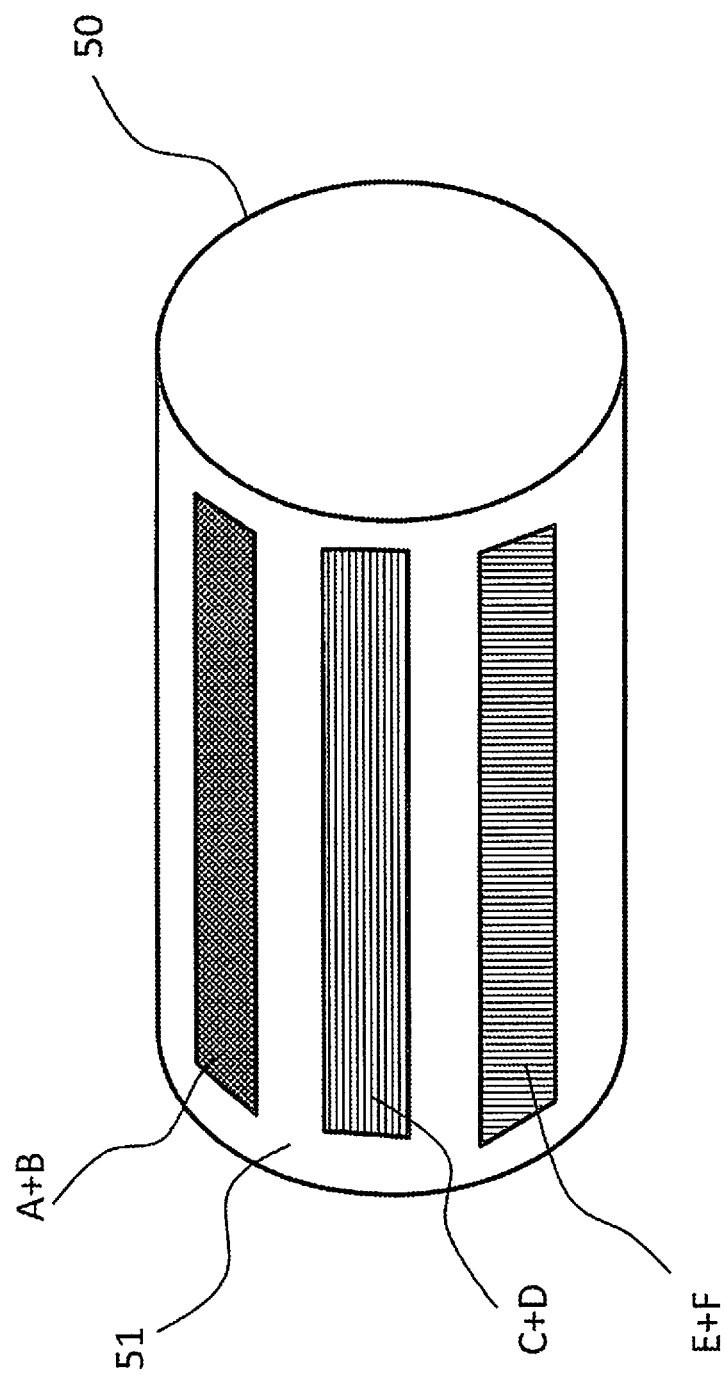
FIG. 13 is a schematic view of another embodiment of a nozzle head according to the present invention.
Figure 14:
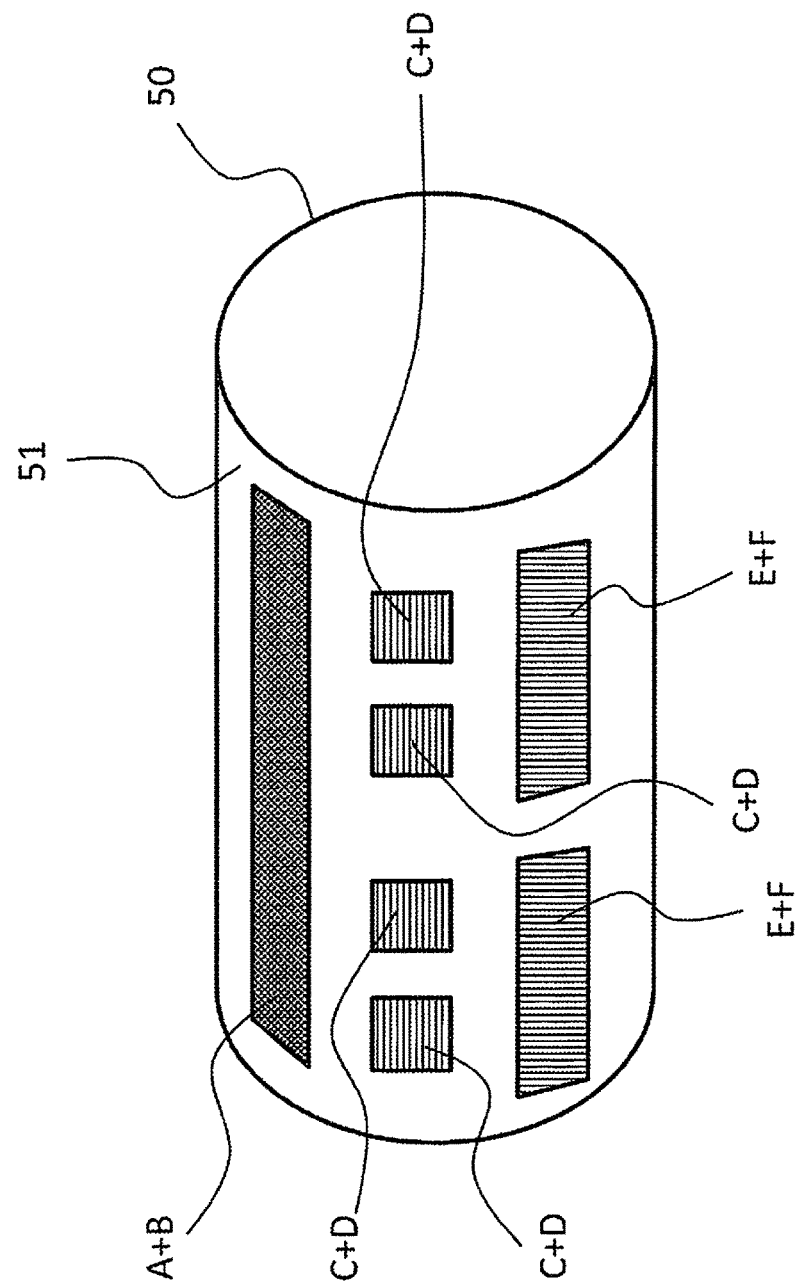
FIG. 14 is a schematic view of yet another embodiment of a nozzle head according to the present invention.

An alternative embodiment according to the present invention is shown in FIGS. 13 and 14. The nozzle head 50 is formed as a cylinder which may be rotated around a rotation axis and precursor zones A+B, C+D, E+F are provided on the outer surface, output face 51, of the nozzle head 50. In this embodiment the substrate 1 may be provided to move over or in front of the outer surface 51 of the nozzle head 50. The nozzle head 50 is a cylindrical nozzle head and the substrate 1 may be arranged to be moved over at least part of the cylindrical outer surface 51 of the nozzle head 50 through which the precursors are introduced. The precursor zones A+B, C+D, E+F have identical dimensions in FIG. 12 and different dimensions in FIG. 13. All or at least one of the different precursor zones A+B, C+D, E+F of embodiment of FIGS. 12 and 13 may be arranged to supply different precursors A, B, C, D, E, F than the other precursor zones A+B, C+D, E+F. The dimensions of the precursor zones may be provided in the same way as in embodiment of FIG. 9.

In FIG. 14, the output face 51 of the nozzle head 50 having a width W extending transversely to the relative moving direction of the nozzle head 50 and the substrate, the width being the length of the cylinder, and a length L extending in the relative moving direction of the nozzle head 50 and the substrate, the length being the perimeter of the cylinder. The output face 51 comprises precursor zones C+D, E+F arranged at different locations on the output face 51 in the direction of the width W of the output face 51. The four second precursor zones C+D are arranged adjacently to each other in the direction of the width and the two third precursor zones E+F are arranged adjacently to each other.

The second precursor zones C+D have length in the direction of the with W less than one fourth of the width W of the output face 51. As, shown in FIG. 9, second precursor zones C+D are arranged adjacently to each other or in line on the output face 51 of the nozzle head 50 in the direction of the width W of the output face 50. The third precursor zones E+F have length in the direction of the with W less than half of the width W of the output face 51. As, shown in FIG. 14, third precursor zones E+F are arranged adjacently to each other or in line on the output face 51 of the nozzle head 50 in the direction of the width W of the output face 50.

In an alternative embodiment the precursor zones C+D, E+F may be arranged at different locations on the output face 51 of the nozzle head 50 in the direction of the width W of the output face 5 and at different locations on the output face 51 of the nozzle head 50 in the direction of the length L of the output face 50. As shown in FIG. 9, second precursor zones C+D and the third precursor zones E+F are arranged on the output face at different locations on the output face 51 of the nozzle head 50 in the direction of the width W of the output face 50 and at different locations on the output face 51 of the nozzle head 50 in the direction of the length L of the output face 50.

The second, or second and third, precursor zones C+D may arranged at least party overlapped in the direction of the length L of the output face 5 and/or at least party overlapped in the direction of the width W of the output face 5, as mentioned in the context of FIG. 9.

The present invention further provides a method for providing coating layers AB, CD, EF on a surface 3 of a substrate 1, 48 by successive surface reactions of precursors A, B, C, D, E, F according to the principles of atomic layer deposition. In the method the apparatus and nozzle according to the present invention are used for forming the different coating layers. The method may comprise supplying the precursors A, B, C, D, E, F from precursor nozzles 2, 4, 8, 10, 12, 14 provided on an output face 11 of a nozzle head 5 and moving the nozzle head 5 relative to the substrate 1 for subjecting the surface 3 of the substrate 1 to successive surface reactions of the at least the first precursor and the second precursor. The method further comprises forming one or more first coating layers AB on the surface 3 of the substrate 1 by supplying precursors from one or more first precursor zones A+B provided to the output face 11 of the nozzle head 5 and forming one or more second coating layers CD on the surface 3 of the substrate 1 by supplying precursors from one or more second precursor zones A+B provided to the output face 11 of the nozzle head 5, the one or more second coating layers CD being different from the one or more first coating layers AB. The difference of the first and second coating layers AB and CD may be the different materials and/or different shapes or dimensions of the coating layers first and second AB, CD.

The method may comprise supplying to the surface 3 of the substrate 1 at least first precursor A and second precursor B via the one or more first precursor zones A+B provided to the output face 11 of the nozzle head 5 for forming a first coating layer AB on the surface 3 of the substrate 1, and supplying to the surface 3 of the substrate 1 at least third precursor C and fourth precursor D via the one or more second precursor zone C+D provided to the output face 11 of the nozzle head 5 for forming a second coating layer CD on the surface 3 of the substrate 1, the second coating layer CD being different material than the first coating layer AB.

In one embodiment the method comprises supplying first precursor A from at least one first precursor nozzle 2 and second precursor B from at least one second precursor nozzle 4 for subjecting the surface 3 of the substrate 1 to successive surface reactions of the first precursor A and the second precursor B and forming the first coating layer AB on the surface 3 of the substrate 1 the at least one first and second precursor nozzle 2, 4 being provided to the first precursor zone A+B, and supplying third precursor C from at least one third precursor nozzle 8 and fourth precursor D from at least one fourth precursor nozzle 10 for subjecting the surface 3 of the substrate 1 to successive surface reactions of the third precursor C and the fourth precursor D and forming the second coating layer CD on the surface 3 of the substrate 1, the at least one third and fourth precursor nozzle 8, 10 being provided to the second precursor zone A+B. The first, second, third and fourth precursors A, B, C, D are different precursors, or alternatively the first and third precursors A, C are different precursors, and the second and fourth precursor B, D are same precursors, and different than the first and third precursors A, C).

In one embodiment the method comprises providing one or more coating layers AB, CD on one or more first limited sub-areas 30 of the surface 3 of the substrate 1 and leaving one or more second limited sub-areas without coating layers by synchronised supply of the precursors A, B, C, D, E, F from the precursor nozzles 2, 4, 8, 10, 12, 14, respectively, and simultaneous moving of the nozzle head 5 relative to the substrate 1. This may be achieved moving the nozzle head 5 such that movements of the at least one first precursor nozzle 2 and the second precursor nozzle 4 of the one or more first precursor zones A+B over the surface 3 of the substrate 1 are overlapped only on the first limited sub-areas 30 of the surface 3 of the substrate 1 for providing one or more coating layers AB on the first limited sub-areas 30. Alternatively it is achieved by moving the nozzle head 5 such that the movements of the third precursor nozzle 8 and the fourth precursor nozzle 10 of the one or more second precursor zones C+D over the surface 3 of the substrate 1 are overlapped only on the first limited sub-areas 30 of the surface 3 of the substrate 1 for providing one or more coating layers CD on the first limited sub-areas 30. This may further be achieved by moving the nozzle head 5 such that the movements of the first precursor nozzle 2 and the second precursor nozzle 4 of the one or more first precursor zones A+B, and the third precursor nozzle 8 and the fourth precursor nozzle 10 of the one or more second precursor zones C+D, respectively, over the surface 3 of the substrate 1 are overlapped only on the first limited sub-areas 30 of the surface 3 of the substrate 1 for providing one or more coating layers AB, CD on the first limited sub-areas 3.

It will be obvious to a person skilled in the art that, as the technology advances, the inventive concept can be implemented in various ways. The invention and its embodiments are not limited to the examples described above but may vary within the scope of the claims.

The invention claimed is:

1. A nozzle head for providing a coating on a surface of a substrate by subjecting the surface of the substrate to successive surface reactions of at least two precursors according to principles of atomic layer deposition, the nozzle head being arranged to be moved relative to the substrate in a moving direction, the nozzle head comprising:
an output face via which the at least two precursors are supplied to the surface of the substrate, the output face having a width extending transversely to the relative moving direction of the nozzle head and the substrate and a length extending in the relative moving direction of the nozzle head and the substrate;
one or more first precursor zones provided to the output face of the nozzle head; and one or more second precursor zones provided to the output face of the nozzle head,
each of the one or more first precursor zones comprise at least two precursor nozzles arranged to supply at least two precursors to the surface of the substrate for forming a first coating layer on the surface of the substrate, each of the one or more second precursor zones arranged to supply at least two precursors to the surface of the substrate for simultaneously forming a second coating layer on the surface of the substrate, the second coating layer being different from the first coating layer, wherein
the at least one or more first precursor zones have a length in the direction of the width less than the width of the output face and arranged at different locations on the output face of the nozzle head in the direction of the width of the output face and at different locations on the output face of the nozzle head in the direction of the length of the output face.

2. The nozzle head according to claim 1, wherein at least one or more of the first and second precursor zones have a length in the direction of the width less than the direction of the width of the output face and arranged adjacently to each other or in line on the output face of the nozzle head in the direction of the width of the output face.

3. The nozzle head according to claim 1, wherein at least one or more of the first and second precursor zones are arranged at least partly overlapped in the direction of the length of the output face.

4. The nozzle hear according to claim 1, wherein the one or more first precursor zones are provided to the output face of the nozzle head and arranged to supply at least a first precursor and a second precursor to the surface of the substrate for forming the first coating layer on the surface of the substrate; and the one or more second precursor zones are provided to the output face of the nozzle head and arranged to supply at least a third precursor and a fourth precursor to the surface of the substrate for forming a second coating layer on the surface of the substrate.

5. The nozzle head according to claim 4, wherein the one or more first precursor zones comprise at least one first precursor nozzle and at least one second precursor nozzle for subjecting the surface of the substrate to successive surface reactions of the first precursor and the second precursor for forming the first coating layer on the surface of the substrate, and that the one or more second precursor zones comprise at least one third precursor nozzle and at least one fourth precursor nozzle for subjecting the surface of the substrate to successive surface reactions of the third precursor and the fourth precursor for forming a second coating layer on the surface of the substrate.

6. The nozzle head according to claim 5, wherein the at least one precursor nozzle and the at least one second precursor nozzle are arranged to supply first and second precursors, respectively, and that the at least one third precursor nozzle and the at least one fourth precursor nozzle are arranged to supply third and fourth precursor, respectively, in which:
the first, second, third and fourth precursors are different precursors; or
the first and third precursors are different precursors, and the second and fourth precursors are the same precursors, and different than the first and third precursors.

7. The nozzle head according to claim 5, wherein:
all of the at least one first and second precursor nozzles of the first precursor zone have identical dimensions on the output face of the nozzle head; or
all of the at least one third and fourth precursor nozzles of the second precursor zone have identical dimensions on the output face of the nozzle head; or
at least two of the at least one first and second precursor nozzles of the first precursor zone have different dimensions n the output face of the nozzle head in the direction of the width of the output face; or
at least two of the at least one third and fourth precursor nozzles of the second precursor zone have different dimensions on the output face of the nozzle head in the direction of the width of the output face.

8. The nozzle head according to claim 7, wherein the output face of the nozzle head has the width and the length, and the precursor nozzles have longitudinal direction in the direction of the width of the output face and that
all of the at least one first, second, third and fourth precursor nozzles have identical longitudinal dimensions in the direction of the width of the output face of the nozzle head; or
the at least one first and second precursor nozzles have different longitudinal dimensions in the direction of the width of the output face of the nozzle head than the at least one third and fourth precursor nozzles.

9. The nozzle head according to claim 1, wherein the nozzle head comprises:
at least one discharge nozzle provided to the output face between adjacent precursor zones for discharging precursors; or
at least one discharge nozzle provided to the output face between the first precursor zone and the second precursor zone for discharging precursor; or
at least one purge gas nozzle provided to the output face between adjacent precursor zones for supplying purge gas; or
at least one purge gas nozzle provided to the output face between the first precursor zone and the second precursor zone for supplying purge gas.

10. The nozzle head according to claim 1, wherein:
the one or more first precursor zones comprises at least one discharge nozzle provided to the output face and between the first and second precursor nozzles; or
the one or more second precursor zones comprises at least one discharge nozzle provided to the output face and between the third and fourth precursor nozzles; or the one or more first precursor zones comprises at least one discharge nozzle provided to the output face and between the first and second precursor nozzles, and one or more second precursor zones comprises at least one discharge nozzle provided to the output face and between the third and fourth precursor nozzles; or the one or more first precursor zones comprises at least one purge gas nozzle provided to the output face and between the first and second precursor nozzles; or the one or more second precursor zones comprises at least one purge gas nozzle provided to the output face and between the third and fourth precursor nozzles; or the one or more first precursor zones comprises at least one purge gas nozzle provided to the output face and between the first and second precursor nozzles, and one or more second precursor zones comprises at least one purge gas nozzle provided to the output face and between the third and fourth precursor nozzles.

11. The nozzle head according to claim 1, wherein:
all of the one or more first precursor zones have identical dimensions on the output face of the nozzle head; or all of the one or more second precursor zones have identical dimensions on the output face of the nozzle head; or at least two of the first precursor zones have different dimensions on the output face of the nozzle head; or at least two of the second precursor zones have different dimensions on the output face of the nozzle head;

the one or more second precursor zones have different dimensions on the output face of the nozzle head than the one or more first precursor zones;

at least one of the one or more second precursor zones has different dimensions on the output face of the nozzle head than the one or more first precursor zones.

12. An apparatus for a coating process in which coating layers are provided on a surface of a substrate by successive surface reactions of precursors according to the principles of atomic layer deposition, the apparatus comprising:
a nozzle head having an output face provided with one or more first precursor zones provided to the output face comprising at least two precursor nozzles arranged to supply at least a first precursor and a second precursor to the surface of the substrate for providing a first coating layer on the surface of the substrate and one or more second precursor zones provided to the output face arranged to supply at least a third precursor and a fourth precursor to the surface of the substrate for simultaneously forming a second coating layer on the surface of the substrate, the second coating layer being a different material than the first coating layer;

a precursor supply system for dosing the at least first and second precursors and the at least third and fourth precursors to the nozzle head and the precursor nozzles; and a moving system for moving the nozzle head relative to the substrate in a relative moving direction for subjecting the surface of the substrate to successive surface reactions of the at least first and second precursors and the at least third and fourth precursors, the output face of the nozzle head having a width extending transversely to the relative moving direction of the nozzle head and the substrate and a length extending in the relative moving direction of the nozzle head and the substrate;

wherein the one or more first precursor zones and the one or more second precursor zones are arranged at different locations on the output face of the nozzle head in the direction of the width of the output face and at different locations on the output face of the nozzle head in the direction of the length of the output face.

13. The apparatus according to claim 12, wherein:
the at least two of the first and second precursor zones are arranged adjacently to each other or in line on the output face of the nozzle head in the direction of the width of the output face; or the at least two of the first and second precursor zones are arranged at different locations on the output face of the nozzle head in the direction of the width of the output face and at different locations on the output face of the nozzle head in the direction of the length of the output face; or the at least two of the first and second precursor zones are arranged at least partly overlapped in the direction of the length of the output face; or the at least two of the first and second precursor zones are arranged at least partly overlapped in the direction of the width of the output face; or the at least two of the first and second precursor zones are arranged at least partly overlapped in the direction of the length and in the direction of the width of the output face.

14. The apparatus according to claim 12, wherein at least two of the first, second, third and fourth precursor zones are different precursor zones, the at least two different precursor zones being arranged to provide different coating layers on the surface of the substrate.

15. The apparatus according to claim 14, wherein at least two of the first, second third and fourth precursor zones have different dimensions on the output face of the nozzle head for providing coating layers with different dimensions on the surface of the substrate, respectively.

16. The apparatus according to claim 14, wherein the output face of the nozzle head has a width and a length, the width being the dimension perpendicular to the relative moving direction of the substrate and the nozzle head and the length being the dimension parallel to the relative moving direction of the substrate and the nozzle head, and that:
all of the one or more first precursor zones have identical dimensions on the output face of the nozzle head;

all of the one or more second precursor zones have identical dimensions on the output face of the nozzle head;

at least two of the first precursor zones have different dimensions on the output face of the nozzle head in the direction of the width of the output face;

at least two of the second precursor zones have different dimensions on the output face of the nozzle head in the direction of the width of the output face;

all of the first and second precursor zones have identical dimensions on the output face of the nozzle head;

the one or more second precursor zones have different dimensions on the output face of the nozzle head than the one or more first precursor zones in the direction of the width of the output face;

at least one of the one or more second precursor zones has different dimensions on the output face of the nozzle head than the one or more first precursor zones in the direction of the width of the output face.

17. The apparatus according to claim 12, wherein the one or more first precursor zones comprise at least one first precursor nozzle and at least one second precursor nozzle for subjecting the surface of the substrate to successive surface reactions of the first precursor and the second precursor for forming the first coating layer on the surface of the substrate, and that the one or more second precursor zones comprise at least one third precursor nozzle and at least one fourth precursor nozzle for subjecting the surface of the substrate to successive surface reactions of the third precursor and the fourth precursor for forming a second coating layer on the surface of the substrate.

18. The apparatus according to claim 17, wherein the at least one first precursor nozzle and the at least one second precursor nozzle are arranged to supply first and second precursors, respectively, and that the at least one third precursor nozzle and the at least one fourth precursor nozzle are arranged to supply third and fourth precursors, respectively, in which:
- the first, second, third and fourth precursors are different precursors; or
- the first and third precursors are different precursors, and the second and fourth precursors are the same precursors, and different than the first and third precursors.

19. The apparatus according to claim 17, wherein the output face of the nozzle head has the width and the length, and the precursor nozzles have longitudinal direction in the width direction of the output face, and that:
- all of the at least one first and second precursor nozzles of the first precursor zone have identical dimensions on the output face of the nozzle head;
- all of the at least one third and fourth precursor nozzles of the second precursor zone have identical dimensions on the output face of the nozzle head;
- at least two of the at least one first and second precursor nozzles of the first precursor zone have different longitudinal dimensions on the output face of the nozzle head;
- at least two of the at least one third and fourth precursor nozzles of the second precursor zone have different longitudinal dimensions on the output face of the nozzle head;
- all of the at least one first, second, third and fourth precursor nozzles have identical longitudinal dimensions on the output face of the nozzle head; or
- the at least one first and second precursor nozzles have different longitudinal dimensions on the output face of the nozzle head than the at least one third and fourth precursor nozzles.

20. The apparatus according to claim 17, wherein the apparatus further comprises a control system for controlling the coating process, the control, system is arranged to control the precursor supply system and the moving system in co-operation for providing one or more coating layers on one or more first limited sub-areas of the surface of the substrate and leaving one or more second limited sub-areas without coating layers by synchronized supply of the precursors from the precursor nozzles, respectively, and simultaneous movement of the nozzle head relative to the substrate.

21. The apparatus according to claim 20, wherein the control system is arranged to move the nozzle head relative to the substrate by controlling the moving system such that:
- the movement of the first precursor nozzle and the second precursor nozzle over the surface of the substrate are overlapped only on the first limited sub-areas of the surface of the substrate for providing one or more coating layers on the first limited sub-areas; or
- the movement of the third precursor nozzle and the fourth precursor nozzle over the surface of the substrate are overlapped only on the first limited sub-areas of the surface of the substrate for providing one or more coating layers on the first limited sub-areas; or
- the movement of the first precursor nozzle and the second precursor nozzle, and the third precursor nozzle and the fourth precursor nozzle, respectively, over the surface of the substrate are overlapped only on the first limited sub-areas of the surface of the substrate for providing one or more coating layers on the first limited sub-areas.

22. The apparatus according to claim 20, wherein the control system is arranged to:
- move the nozzle head relative to the substrate in reciprocating movement between a first relative position and a second relative position over the surface of the substrate; or
- move the nozzle head in relation to the substrate along a curved or a loop coating path over the surface of the substrate.

* * * * *